(12) United States Patent
Park

(10) Patent No.: US 7,340,632 B2
(45) Date of Patent: Mar. 4, 2008

(54) DOMAIN CROSSING DEVICE

(75) Inventor: Nak-Kyu Park, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 624 days.

(21) Appl. No.: 11/023,433

(22) Filed: Dec. 29, 2004

(65) Prior Publication Data

US 2005/0185500 A1    Aug. 25, 2005

(30) Foreign Application Priority Data

Jan. 10, 2004 (KR) ............ 10-2004-0001817
Mar. 26, 2004 (KR) ............ 10-2004-0020647

(51) Int. Cl.
*G06F 1/04* (2006.01)
*G06F 1/12* (2006.01)

(52) U.S. Cl. ............ 713/401; 713/500; 713/503

(58) Field of Classification Search ............ None
See application file for complete search history.

(56) References Cited

U.S. PATENT DOCUMENTS 6,980,479 B2 * 12/2005 Park ............ 365/233
2002/0129215 A1 * 9/2002 Yoo et al. ............ 711/167
2003/0081713 A1   5/2003 Pontius et al.
2004/0105292 A1 * 6/2004 Matsui ............ 365/63
2004/0107373 A1   6/2004 Ferrara
2004/0218461 A1   11/2004 Park

FOREIGN PATENT DOCUMENTS

JP    2004-327008 A    11/2004

* cited by examiner

*Primary Examiner*—Dennis M. Butler
(74) *Attorney, Agent, or Firm*—McDermott Will & Emery LLP

(57) ABSTRACT

A domain crossing device for use in a semiconductor memory device, including: a unit for comparing a phase of an internal clock signal with a phase of a delay locked loop (DLL) clock signal to generate a first clock selection signal and a phase detection period signal in response to a detection starting signal and a second clock selection signal; a unit for generating a plurality of initial latency signals in response to the phase detection period signal, the detection starting signal and a column address strobe (CAS) latency signal; a unit for receiving the plurality of initial latency signals and the detection starting signal to generate a plurality of latency signals, a clock selection signal and the second clock selection signal; and a unit for generating the detection starting signal based on a self refresh signal, a power-up signal and a DLL disable signal.

22 Claims, 25 Drawing Sheets

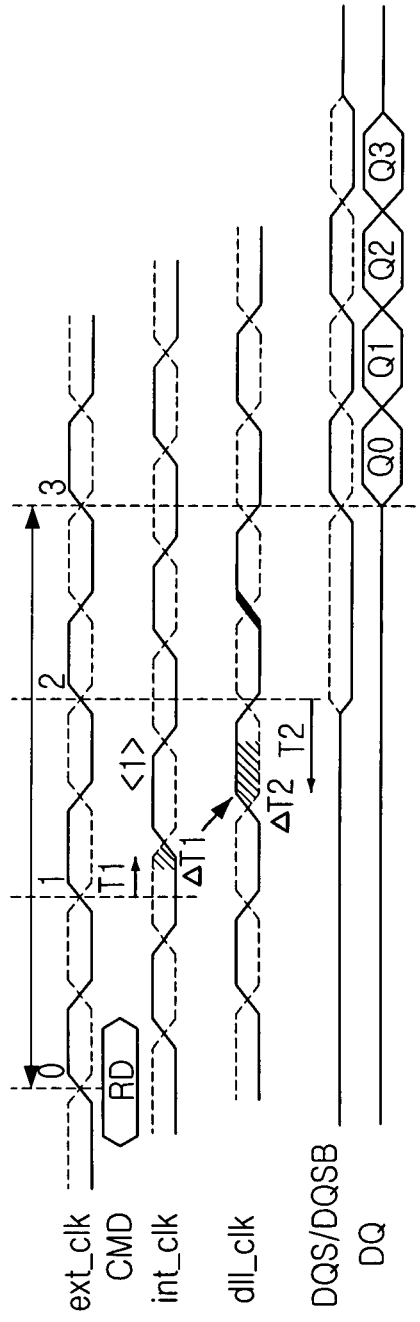
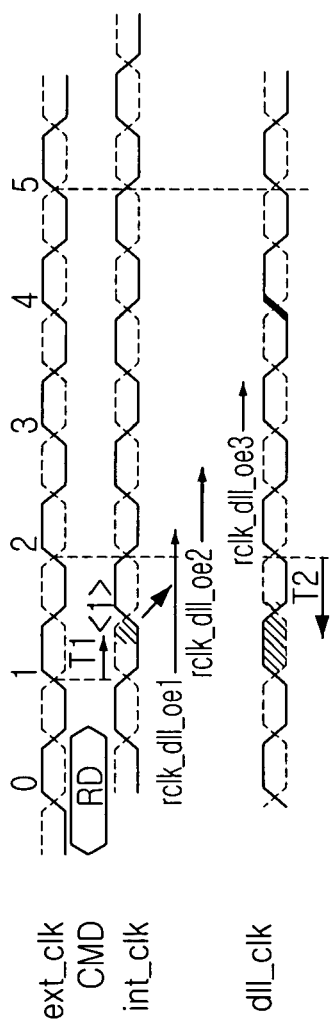

DOMAIN CROSSING DEVICE

FIELD OF INVENTION

The present invention relates to a semiconductor device; and, more particularly, to a domain crossing device for use in a semiconductor memory device.

DESCRIPTION OF PRIOR ART

Generally, a semiconductor memory device includes more than one clock domain. That is, a data-receiving block of the semiconductor memory device is operated in synchronization with a first clock signal, whereas a data-transmitting block of the semiconductor memory device is operated in synchronization with a second clock signal. An interface between clock domains is called a domain crossing where signals cross a boundary of the clock domains.

FIG. 1 is a block diagram showing a conventional semiconductor memory device including a domain crossing device.

As shown, the conventional semiconductor memory device includes a first clock domain block 100 and a second clock domain block 200. The first clock domain block 100 uses an internal clock signal int_clk for a reference clock signal, and the second clock domain block 200 uses a delay locked loop (DLL) clock signal dll_clk for a reference clock signal.

Data and command signals are inputted to the first clock domain block 100 in synchronization with an external clock signal ext_clk. The inputted data and command signals are processed in the first clock domain block 100 in synchronization with the internal clock signal int_clk. Therefore, the data and the command signals should be converted so that a reference clock signal for the data and the command signals can be changed from the external clock signal ext_clk to the internal clock signal int_clk.

In the second clock domain block 200, the DLL clock signal dll_clk is used as a reference clock signal for outputting data in synchronization with the external clock signal ext_clk. Therefore, output signals of the first clock domain block 100 should be converted in order to change a reference clock signal of the output signals from the internal clock signal int_clk to the DLL clock signal dll_clk.

That is, a domain crossing operation is required for changing a reference clock signal.

FIGS. 2A to 2C are timing diagrams showing domain crossing operations.

Several symbols shown in FIGS. 2A to 2C are explained below.

A first time difference T1 is a time difference between the external clock signal ext_clk and the internal clock signal int_clk. A second time difference T2 is a time difference between the external clock signal ext_clk and the DLL clock signal dll_clk. A first timing variation ΔT1 is a rising timing variation of the internal clock signal int_clk, wherein the rising timing variation is generated due to variations of process, voltage and temperature (PVT). A second timing variation ΔT2 is a rising timing variation of the DLL clock signal dll_clk, wherein the rising timing variation is generated due to the variations of PVT.

FIG. 2A is a timing diagram showing an operation of a single-clock domain crossing.

As shown, the read command RD is inputted in synchronization with the external clock signal ext_clk, and a first to a fourth data Q0 to Q3 are outputted in synchronization with external clock signal ext_clk in response to the read command signal RD. Herein, since a column address strobe (CAS) latency is 3, the first to the fourth data Q0 to Q3 are outputted three clock cycles later from the input timing of the read command RD. That is, during the operation of the single-clock domain crossing, the first to the fourth data Q0 to Q3 are synchronized with an edge of the DLL clock signal dll_clk corresponding to the internal clock signal int_clk to thereby output the first to the fourth data Q0 to Q3 in synchronization with the external clock signal ext_clk satisfying the CAS latency.

FIG. 2B is a timing diagram showing an operation of a multi-clock domain crossing. Herein, it is assumed that the CAS latency is 5. However, since an operational frequency is higher than that of the single-clock domain crossing, data output timing is similar to that of the single-clock domain crossing.

As shown in FIG. 2B, it is possible that a rising edge of the internal clock signal int_clk lags behind a rising edge of the DLL clock signal dll_clk since a portion of the second timing variation ΔT2 is previous to the first timing variation ΔT1. Therefore, the above-mentioned method of the single clock domain crossing cannot be used in this case.

Therefore, a reference clock conversion from the internal clock signal int_clk to the DLL clock signal dll_clk is not directly performed but gradationally performed through a plurality of DLL output clock signals rclk_dll_oe1, rclk_dll_oe2 and rclk_dll_oe3. The above mentioned conversion should be completed before the first to the fourth data Q0 to Q3 are outputted.

FIG. 2C is a timing diagram showing an operation of a phase detection domain crossing. Herein, it is assumed that the CAS latency is 7. In this case, the operational frequency is higher than that of the multi-clock domain crossing.

As shown in FIG. 2C, since the operational frequency is so high that the second timing variation ΔT2 leads the first timing variation ΔT1 by one, two or three clocks. In this case, the above-mentioned method of the multi-clock domain crossing cannot be used because the reference clock conversion cannot be completed before the first to the fourth data Q0 to Q3 are outputted.

According to the phase detection domain crossing, a phase difference between the internal clock signal int_clk and the DLL clock signal dll_clk is detected for determining how many DLL clock cycles are required in order to output the first to the forth data Q0 to Q3 satisfying the CAS latency. Therefore, even if the CAS latency is fixed to 7, the number of the DLL clock cycles is varied according to the phase difference.

As regards the case (a), a falling clock signal of the DLL clock signal dll_clk is selected to be synchronized with the internal clock signal int_clk and one DLL clock cycle is required for the phase detection. Then, the first to the fourth data Q0 to Q3 are outputted after five DLL clock cycles. As regards the case (b), a rising clock signal of the DLL clock signal dll_clk is selected to be synchronized with the inter clock signal int_clk spending two DLL clock cycles for the phase detection, and then, the first to the fourth data Q0 to Q3 are outputted after four DLL clock cycles. Similarly, regarding the case (c), the falling clock signal of the DLL clock signal dll_clk is selected to be synchronized with the internal clock signal int_clk, and the first to the fourth data Q0 to Q3 are outputted after four DLL clock cycles.

FIG. 3 is a block diagram showing a conventional domain crossing device.

As shown, the conventional domain crossing device includes a detection starting unit 10, a phase detection unit 20, a delay model unit 30 and a latency detection unit 40.

The detection starting unit 10 generates a detection starting signal startz so that a detection operation for a domain crossing can be started when a delay locked loop (DLL) begins to operate or a self refresh operation is terminated.

The phase detection unit 20 detects a phase difference between an internal clock signal int_clk and a DLL clock signal dll_clk in response to the detection starting signal startz to thereby output a phase detection period signal fpvt_det.

The delay model unit 30 compensates a flight time generated while data travel to a data output pin (DQ pin) by delaying the phase detection period signal fpvt_det to thereby output a delayed phase detection period signal fpvt_detd.

The latency detection unit 40 detects an actual latency required to output the data based on the CAS latency and the delayed phase detection period signal fpvt_detd.

The detection starting unit 10 generates the detection starting signal startz when a self refresh signal sref or a DLL disable signal dis_dll is inactivated. The phase detection unit 20 compares phases of a falling edge DLL clock signal fclk_dll and a rising edge DLL clock signal rclk_dll with a phase of the internal clock signal int_clk in order to generate a selection signal selB and the phase detection period signal fpvt_det in response to the detection starting signal startz. The selection signal selB determines which of the falling edge DLL clock signal fclk_dll and the rising edge DLL clock signal rclk_dll has a minimum delay from the internal clock signal int_clk. A pulse width of the phase detection period signal fpvt_det corresponds to a delay time from a timing of activating the detection starting signal startz to a timing of outputting the selection signal selB.

Thereafter, the delay model unit 30 delays the phase detection period signal fpvt_det for a predetermined delay time in order to compensate a flight time generated while the data travel to the DQ pin. Then, the delay model unit 30 outputs the delayed phase detection period signal fpvt_detd. The latency detection unit 40 divides the internal clock signal int_clk and generates a first to a third latency signals A to C by comparing the divided internal clock signal with the delayed phase detection period signal fpvt_detd.

Meanwhile, when a delay locked loop (DLL) begins to operate or a self refresh operation is terminated, about 200tCLK is provided for performing the domain crossing operation to the internal clock signal int_clk and the DLL clock signal dll_clk in order to guarantee a stable operation of the DLL. Herein, the tCLK corresponds to a clock cycle. Therefore, the domain crossing device periodically activates the detection start signal startz during the 200tCLK so that the detection operation of the phase detection unit 20 and the latency detection unit 40 can be performed. The detection operation is terminated when a semiconductor memory device begins a data access operation.

FIG. 4 is a schematic circuit diagram showing the detection starting unit 10 shown in FIG. 3.

As shown, the detection starting unit 10 includes a clock edge detection unit 11, a first inverter I1, a second inverter I2, an off unit 12, a first p-type metal oxide semiconductor (PMOS) transistor PM1, a first latch unit 13, a divider unit 10, an activation period extension unit 15 and an output unit 16.

The clock edge detection unit 11 includes two fall edge detection units for detecting falling edges of the self refresh signal sref and the DLL disable signal dis_dll. The first inverter inverts the DLL disable signal dis_dll. The off unit 13 receives an output signal of the first inverter I1, a power-up signal pwrup and a row address strobe (RAS) idle signal rasidle for inactivate an enable signal en. The first PMOS transistor PM1 generates the enable signal en in response to an output signal of the clock edge detection unit 11.

The first latch unit 13 latches the enable signal en and outputs the enable signal en in response to an output signal of the off unit 12. The second inverter I2 inverts the internal clock signal int_clk. The divider unit 10, having a plurality of dividers, divides the internal clock signal int_clk for generating a period of the detection starting signal startz. The activation period extension unit 15 adjusts an activation period of the detection starting signal startz for extending the activation period of the detection starting signal startz. The output unit 16 receives output signals of the divider unit 10 and the activation period extension unit 15 for outputting the detection starting signal startz.

Operations of the detection starting unit 10 are described below.

The clock edge detection unit 11 detects falling edges of the self refresh signal sref and the DLL disable signal dis_dll. Then, the first PMOS transistor PM1 activates the enable signal en based on the output signal of the clock edge detection unit 11. Thereafter, the divider unit 10 divides the internal clock signal int_clk in response to the enable signal en to thereby generate the period of the detection starting unit startz. The activation period extension unit 15 extends the activation period of the detection starting signal startz based on the enable signal en. Thereafter, the output unit 16 outputs the detection starting unit startz after performing a logic operation to the output signals of the divider unit 10 and the activation period extension unit 15.

Meanwhile, if the DLL disable signal dis_dll is activated, or, if the power-up signal pwrup or the RAS idle signal rasidle is inactivated, the off unit 12 controls the first latch unit 13 not to generate the enable signal en by activating an output signal of the off unit 12, whereby a logic level of the detection starting signal startz is not changed.

FIG. 5 is a block diagram showing the phase detection unit 20 shown in FIG. 3.

As shown, the phase detection unit 20 includes a phase detector 21, a selector 22 and a phase detection period signal generator 23.

The phase detector 21 generates an internal data oe00i which synchronizes with the internal clock signal int_clk, and, then, synchronizes the internal data oe00i with the falling edge DLL clock signal fclk_dll and the rising edge DLL clock signal rclk_dll for generating a falling clock output signal f_out and a rising clock output signal r_out. Thereafter, the selector 22 selects one of the falling clock output signal f_out and the rising clock output signal r_out and generates the selection signal selB. The selected clock output signal is activated earlier than the other, and the selection signal selB indicates that which of the falling clock output signal f_out and the rising clock output signal r_out has been selected.

The phase detector 21 activates an output data oe01 in response to the selection signal selB and terminates the phase detection operation. Thereafter, the phase detection period signal generator 23 generates the phase detection period signal fpvt_det whose pulse width corresponds to a time period from an activation timing of the detection starting signal startz to an activation timing of the output data oe01.

That is, it is determined which of the falling edge DLL clock signal fclk_dll and the rising edge DLL clock signal rclk_dll is more closely synchronized with the internal clock signal int_clk by comparing phases of the falling clock output signal f_out and the rising clock output signal r_out generated by synchronizing the internal data oe00i with the falling edge DLL clock signal fclk_dll and the rising edge DLL clock signal rclk_dll. Then, the selection signal selB is generated based on the comparison result. Thereafter, the phase detection period signal fpvt_det whose pulse width corresponds to the time period from an activation timing of the detection starting signal startz to a timing of the determination.

FIG. 6A is a schematic circuit diagram showing the phase detector 21 shown in FIG. 5.

As shown, the phase detector 21 includes a first flip-flop 21A, a second flip-flop 21B, a third flip-flop 21C and a termination unit 21D.

The first flip-flop 21A outputs the internal data oe00i in synchronization with the internal clock signal int_clk when the detection starting signal startz is activated. The second flip-flop 21B generates the falling clock output signal f_out by synchronizing the internal data oe00i with the falling edge DLL clock signal fclk_dll when the detection starting signal startz is activated. Likewise, the third flip-flop 21C generates the rising clock output signal r_out by synchronizing the internal data oe00i with the rising edge DLL clock signal rclk_dll when the detection starting signal startz is activated.

If the detection starting signal startz is activated, the first flip-flop 21A outputs a power supply voltage VDD as the internal data oe00i at a rising edge of the internal clock signal int_clk. The power supply voltage VDD is connected to an input terminal D of the first flip-flop 21A. Thereafter, the second flip-flop 21B outputs the falling clock output signal f_out at a rising edge of the falling edge DLL clock signal fclk_dll, and the third flip-flop 21C outputs the rising clock output signal r_out at a rising edge of the rising edge DLL clock signal rclk_dll. Then, if the selection signal selB is inputted to the termination unit 21D, the termination unit 21D activates the output data oe01 indicating that the phase detection operation is terminated.

FIG. 6B is a schematic circuit diagram showing the selector 22 shown in FIG. 5.

As shown, the selector 22 includes a control unit 22A, a delay unit 22B, a transfer gate unit 22C, a second latch unit 22D and a third inverter I3.

The control unit 22A generates the enable signal en whose pulse width corresponds to a timing difference between activation timings of the falling clock output signal f_out and the rising clock output signal r_out. The delay unit 22B delays the falling clock output signal f_out to generate a delayed falling clock output signal f_outd. The transfer gate 22C transfers the delayed falling clock output signal f_outd to the latch unit 22D in response to the enable signal en. The latch unit 22D latches an output signal of the transfer gate 22C, and the third inverter I3 inverts an output signal of the latch unit 22D in order to output the inverted signal as the selection signal selB.

Herein, the selB becomes in a logic high level if the falling clock output signal f_out is activated earlier than the rising clock output signal r_out, or, the selB becomes in a logic low level if the rising clock output signal r_out is activated earlier than the falling clock output signal f_out.

FIG. 6C is a schematic circuit diagram showing the phase detection period signal generator 23 shown in FIG. 5.

As shown, the phase detection period signal generator 23 includes a D-type flip-flop for outputting the phase detection period signal fpvt_det.

FIG. 7 is a timing diagram showing operations of the conventional domain crossing device shown in FIG. 3.

As shown, the operations of the conventional domain crossing device are divided into two different operation regions, i.e., a detection region and an active region.

In the detection region, the phase detection operation is periodically performed when the self refresh operation is terminated or the DLL begins to operate. In the active region, an active signal is inputted for the semiconductor memory device to perform a data access operation. Herein, the phase detection operation is performed once at the timing when the semiconductor memory device begins to perform the data access operation, and then, the phase detection operation is terminated.

The detection region, where the DLL disable signal dis_dll and the self refresh signal sref are activated, is described below referring to FIGS. 3 to 7.

The detection starting unit 10 activates the detection starting signal startz in response to the DLL disable signal dis_dll and the self refresh signal sref. Then, the first flip-flop 21A activates the internal data oe00i in synchronization with the internal clock signal int_clk satisfying a set-up time and a holding time. Thereafter, the internal data oe00i is outputted as the falling clock output signal f_out by synchronizing the internal data oe00i with the falling edge DLL clock signal fclk_dll. Likewise, the internal data oe00i is outputted as the rising clock output signal r_out by synchronizing the internal data oe00i with the rising edge DLL clock signal rclk_dll. The control unit 22A receives the falling clock output signal f_out and the rising clock output signal r_out to generate the enable signal en whose pulse width corresponds to the timing difference between the activation timing of the falling clock output signal f_out and the activation timing of the rising clock output signal r_out. In response to the enable signal en, the selection signal selB becomes in a logic low level. Thereafter, if the selection signal selB is inputted to the termination unit 21D, the termination unit 21D activates the output data oe01 for the phase detection period signal generator 23 to output the output data oe01 as the phase detection period signal fpvt_det.

Thereafter, the delay model unit 30 delays the phase detection period signal fpvt_det for compensating the flight time (Td) and outputs the delayed phase detection period signal fpvt_detd.

The latency detection unit 40 divides the internal clock signal int_clk in response to the detection starting signal startz and generates the first to the third latency signals A to C by comparing the divided internal clock signal with the delayed phase detection period signal fpvt_detd for satisfying the CAS latency considering the delay time generated during the phase detection.

Thereafter, if the active signal is inputted, the phase detection operation is performed once at the timing when the semiconductor memory device begins to perform the data access operation, and then, the phase detection operation is terminated.

FIG. 8 is a timing diagram showing operational problems of the conventional domain crossing device shown in FIG. 3.

As shown, a second to a fifth problems PROBLEM2 to PROBLEM5 are marked.

The second problem PROBLEM2 is that the selection signal selB has an invalid pulse. The third problem PROBLEM3 is that the delayed phase detection period signal fpvt_detd is not in a valid period ((A) to (B)) of the detection starting signal startz. The fourth problem PROBLEM4 is that the termination unit 21D may output an unintended signal when the selection signal selB is changed. The fifth problem PROBLEM5 is that the selection signal selB marked as a bold line is generated during the Nth detection region while the first to the third latency signals A to C are generated during the (N+1)th detection region.

Although not shown in FIG. 8, a first problem PROBLE1 is described below.

As above-mentioned, the detection operation of the conventional domain crossing device is performed only once at the beginning of the active region and is terminated during the active region. Therefore, even if initial states are changed due to variations of process, voltage and temperature (PVT), the change cannot be applied.

FIGS. 9A to 9C are timing diagram showing the above-mentioned problems in detail.

FIG. 9A is a timing diagram showing operations of the selector 22 included in the phase detection unit 20.

As regards a first and a second cases CASE1 and CASE2, the rising clock output signal r_out is activated earlier than the falling clock output signal f_out, and the selection signal selB is normally generated.

As regards a third and a fourth cases CASE3 and CASE4, the falling clock output signal f_out is activated earlier than the rising clock output signal r_out. However, as shown in the fourth case CASE4, the selection signal selB has an abnormal pulse since a logic level of the delayed falling clock output signal f_outd is changed at the activation period of the enable signal en.

FIG. 9B is a timing diagram showing the third problem PROBLEM3.

As regards a first case CASE1, the delay model unit 30 generates the delayed phase detection period signal fpvt_detd by delaying the phase detection period signal fpvt_det for the delay time Td. In this case, the delay time Td is in the valid period (A) to (B) of the detection starting signal startz, and thus, the phase detection period signal fpvt_det can be delayed for the delay time Td to be outputted as the delayed phase detection period signal fpvt_detd. However, as shown in a second case CASE2, the phase detection period signal fpvt_det cannot be delayed for the delay time Td since the delay time Td is out of the valid period (A) to (B).

FIG. 9C is a timing diagram showing the fourth problem PROBLEM4.

As above-mentioned, the termination unit 21D receives the selection signal selB in order to output one of the falling clock output signal f_out and the rising clock output signal r_out as the output data oe01. However, as shown in FIG. 9C, since the selection signal selB is changed during the activation period of the enable signal en, the output data oe01 is not stably generated.

Therefore, due to the above-mentioned problems of the conventional domain crossing device, a data may not be synchronized with an external clock signal when the data is outputted from a semiconductor memory device. As a result, a reliability of the semiconductor memory device is degraded.

SUMMARY OF INVENTION

It is, therefore, an object of the present invention to provide a domain crossing device capable of stably performing a domain crossing operation regardless of variations of process, voltage and temperature.

In accordance with an aspect of the present invention, there is provided a domain crossing device for use in a semiconductor memory device, including: a unit for comparing a phase of an internal clock signal with a phase of a delay locked loop (DLL) clock signal to generate a first clock selection signal and a phase detection period signal in response to a detection starting signal and a second clock selection signal; a unit for generating a plurality of initial latency signals in response to the phase detection period signal, the detection starting signal and a column address strobe (CAS) latency signal; a unit for receiving the plurality of initial latency signals and the detection starting signal to generate a plurality of latency signals, a clock selection signal and the second clock selection signal; and a unit for generating the detection starting signal based on a self refresh signal, a power-up signal and a DLL disable signal.

BRIEF DESCRIPTION OF THE DRAWINGS

The above and other objects and features of the present invention will become apparent from the following description of preferred embodiments taken in conjunction with the accompanying drawings, in which:

FIG. 2A is a timing diagram showing an operation of a single-clock domain crossing;

FIG. 2B is a timing diagram showing an operation of a multi-clock domain crossing;

DETAILED DESCRIPTION OF INVENTION

Hereinafter, a domain crossing device in accordance with the present invention will be described in detail referring to the accompanying drawings.

Figure 10:
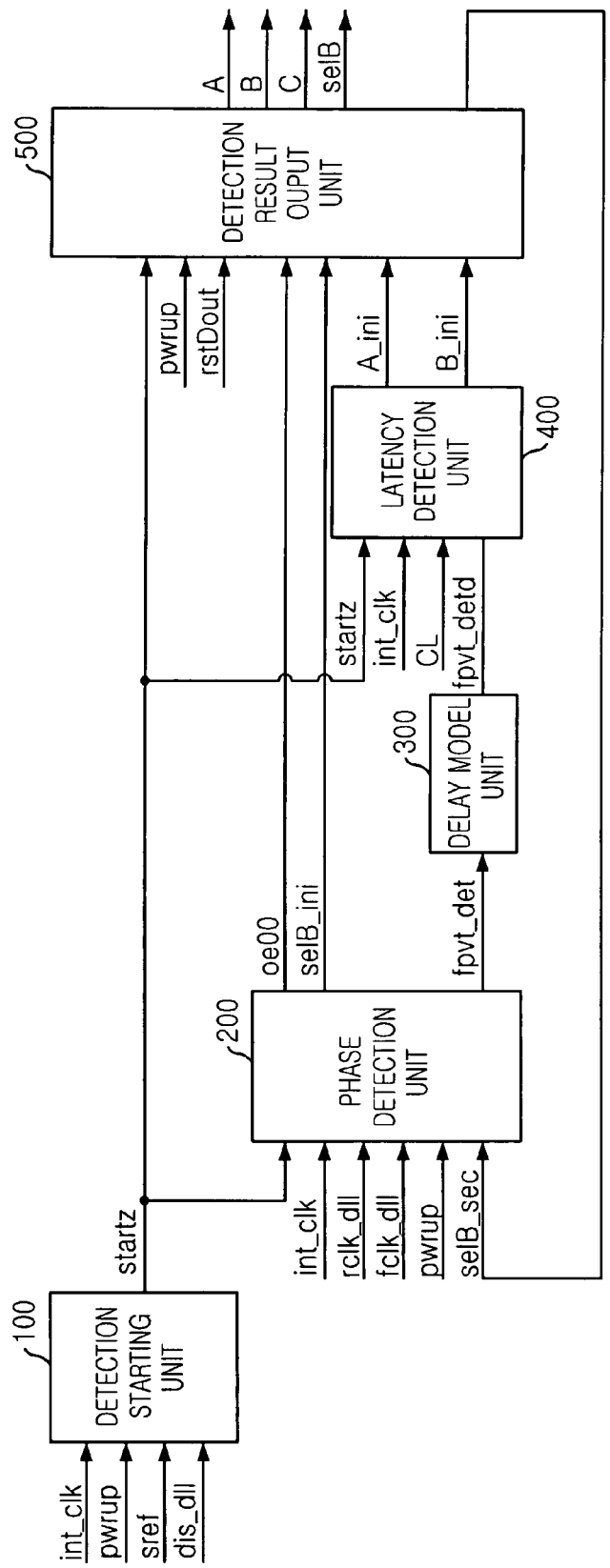
FIG. 10 is a block diagram showing a domain crossing device in accordance with a preferred embodiment of the present invention.

FIG. 10 is a block diagram showing a domain crossing device in accordance with a preferred embodiment of the present invention.

As shown, the domain crossing device includes a detection starting unit 100, a phase detection unit 200, a delay model unit 300, a latency detection unit 400 and a detection result output unit 500.

The detection starting unit 100 generates a detection starting signal startz so that the latency detection unit 400 and the detection result output unit 500 can be operated.

The phase detection unit 200 detects phases of a rising edge DLL clock signal rclk_dll and a falling edge DLL clock signal fclk_dll comparing the phases of the rising and falling edge DLL clock signals rclk_dll and fclk_dll with a phase of an internal clock signal int_clk.

The delay model unit 300 compensates a flight time generated while data travel to a data output pin (DQ pin) by delaying the phase detection period signal fpvt_det to thereby output a delayed phase detection period signal fpvt_detd.

The latency detection unit 400 detects a column address strobe (CAS) latency in response to the delayed phase detection period signal fpvt_detd.

The detection result output unit 500 receives output signals of the phase detection unit 200 and the latency detection unit 400, and outputs the received output signals if an output signal of the phase detection unit 200 has the same result more than twice.

The detection starting unit 100 generates the detection starting signal startz when a self refresh signal sref and a delay locked loop (DLL) disable signal dis_dll are inactivated. Thereafter, the phase detection unit 200 compares phases of a falling edge DLL clock signal fclk_dll and a rising edge DLL clock signal rclk_dll in order to generate an initial clock selection signal selB_ini and the phase detection period signal fpvt_det in response to the detection starting signal startz.

The initial clock selection signal selB determines which of the falling edge DLL clock signal fclk_dll and the rising edge DLL clock signal rclk_dll has a smaller clock skew with the internal clock signal int_clk. A pulse width of the phase detection period signal fpvt_det corresponds to a delay time from a timing of activating the detection starting signal startz to a timing of outputting the initial clock selection signal selB.

Thereafter, the delay model unit 300 delays the phase detection period signal fpvt_det for a predetermined delay time in order to compensate a flight time generated while the data travel to the DQ pin. Then, the delay model unit 300 outputs the delayed phase detection period signal fpvt_detd. The latency detection unit 400 divides the internal clock signal int_clk and generates a first and a second initial latency signals A_ini and B_ini by comparing the divided internal clock signal with the delayed phase detection period signal fpvt_detd.

Thereafter, the detection result output unit 500 outputs a clock selection signal selB and a first to a third latency signals A to C if the initial clock selection signal selB_ini does not change a logic level during two consecutive detection operations and a read operation is not performed.

Figure 11:
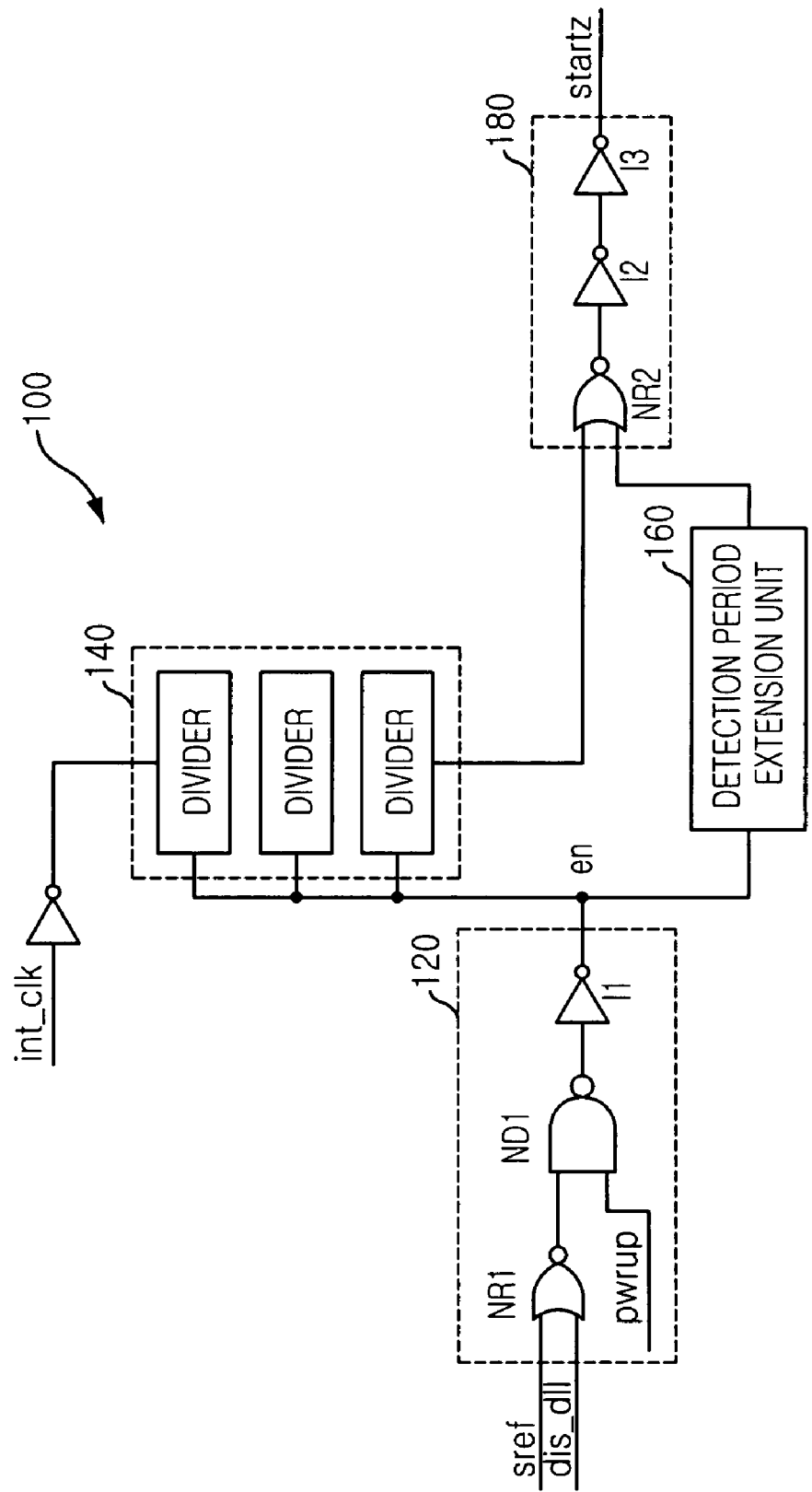
FIG. 11 is a schematic circuit diagram showing a detection starting unit shown in FIG. 10.

FIG. 11 is a schematic circuit diagram showing the detection starting unit 100 shown in FIG. 10.

As shown, the detection starting unit 100 includes an enable signal generation unit 120, a divider unit 100, a detection period extension unit 160 and an output unit 180.

The enable signal generation unit 120 generates an enable signal en in response to the DLL disable signal dis_dll, the self refresh signal sref and a power-up signal pwrup. The divider unit 100 controls a period of the detection starting signal startz by dividing the internal clock signal int_clk in response to the enable signal en. The detection period extension unit 160 extends an activation period of the detection starting signal startz by delaying the enable signal en. The output unit 180 outputs the detection starting signal startz by performing a logic operation to output signals of the divider unit 100 and the detection period extension unit 160.

In detail, the enable signal generation unit 120 includes a first NOR gate NR1, a first NAND gate ND1 and a first inverter I1. The first NOR gate NR1 performs a logic NOR operation to the self refresh signal sref and the DLL disable signal dis_dll. The first NAND gate ND1 performs a logic NAND operation to an output signal of the first NOR gate NR1 and the power-up signal pwrup. The first inverter I1 inverts an output signal of the first NAND gate ND1 and outputs the inverted signal as the enable signal en.

The output unit 180 includes a second NOR gate NR2, a second and a third inverters I2 and I3. The second NOR gate NR2 performs a logic NOR operation to the output signals of the divider unit 100 and the detection period extension unit 160. The second and the third inverters I2 and I3 delay an output signal of the second NOR gate NR2 to thereby output the delayed signal as the detection starting signal startz.

Meanwhile, the detection period extension unit 160 can be embodied by including a plurality of flip-flops for delaying the enable signal en in synchronization with a clock signal or by including a plurality of inverters and capacitors for delaying the enable signal en not synchronizing with the clock signal.

The enable signal generation unit 120 activates the enable signal en if the self refresh signal sref or the DLL disable signal dis_dll is activated while the power-up signal pwrup is activated. The divider unit 140 divides an inverted signal of the internal clock signal int_clk in response to the so that the detection starting signal startz can be periodically activated. The detection period extension unit 160 extends the activation period of the detection starting unit startz by delaying the enable signal en. The output unit 180 outputs the startz receiving the output signals of the divider unit 140 and the detection period extension unit 160.

The detection starting unit 100 periodically activates the detection starting signal startz unless the DLL is disabled and a self refresh operation is performed while the power-up signal pwrup is activated, whereby the domain crossing operation can be continuously performed. Therefore, the domain cross device in accordance with the present invention can continuously detect variations of process, voltage and temperature (PVT). That is, the domain crossing device can control the domain crossing operation according to the PVT variations.

As a result, the domain crossing device in accordance with the present invention can solve the first problem PROBLEM1 of the conventional domain crossing device. In addition, the third problem PROBLEM3 also can be solved since the detection period extension unit 160 is employed.

Figure 12:
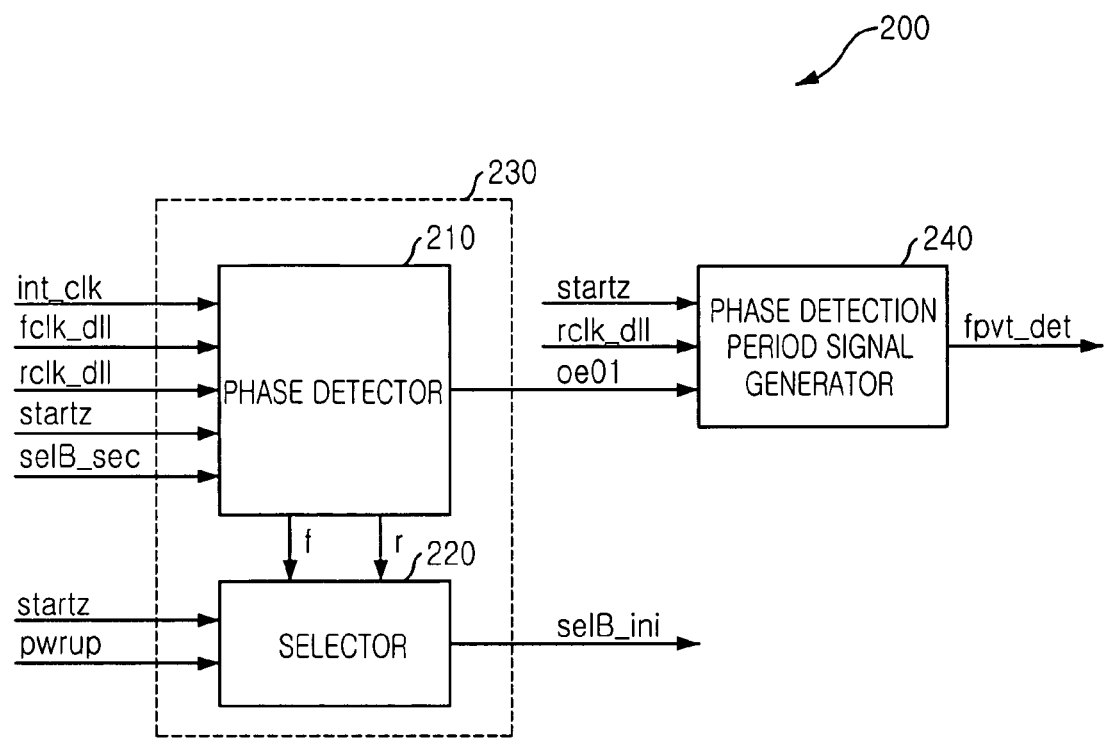
FIG. 12 is a block diagram showing a phase detection unit shown in FIG. 10.

FIG. 12 is a block diagram showing the phase detection unit 200 shown in FIG. 10.

As shown, the phase detection unit 200 includes a detection unit 230 and a phase detection period signal generator 240. The detection unit 230 further includes a phase detector 210 and a selector 220.

The phase detector 210 receives the detection starting signal startz in synchronization with the internal clock signal int_clk and synchronize an internal data oe00i with the falling edge DLL clock signal fclk_dll and the rising edge DLL clock signal rclk_dll in order to generate a falling clock output signal f_out and a rising clock output signal r_out.

The selector 220 selects one of the falling clock output signal f_out and the rising clock output signal r_out. The selected clock output signal is activated earlier than the other.

The phase detection period signal generator 240 generates phase detection period signal fpvt_det whose pulse width corresponds to a time period from a timing of activating the detection starting signal startz to a timing of terminating a phase detection operation of the detection unit 230.

Figure 13A:
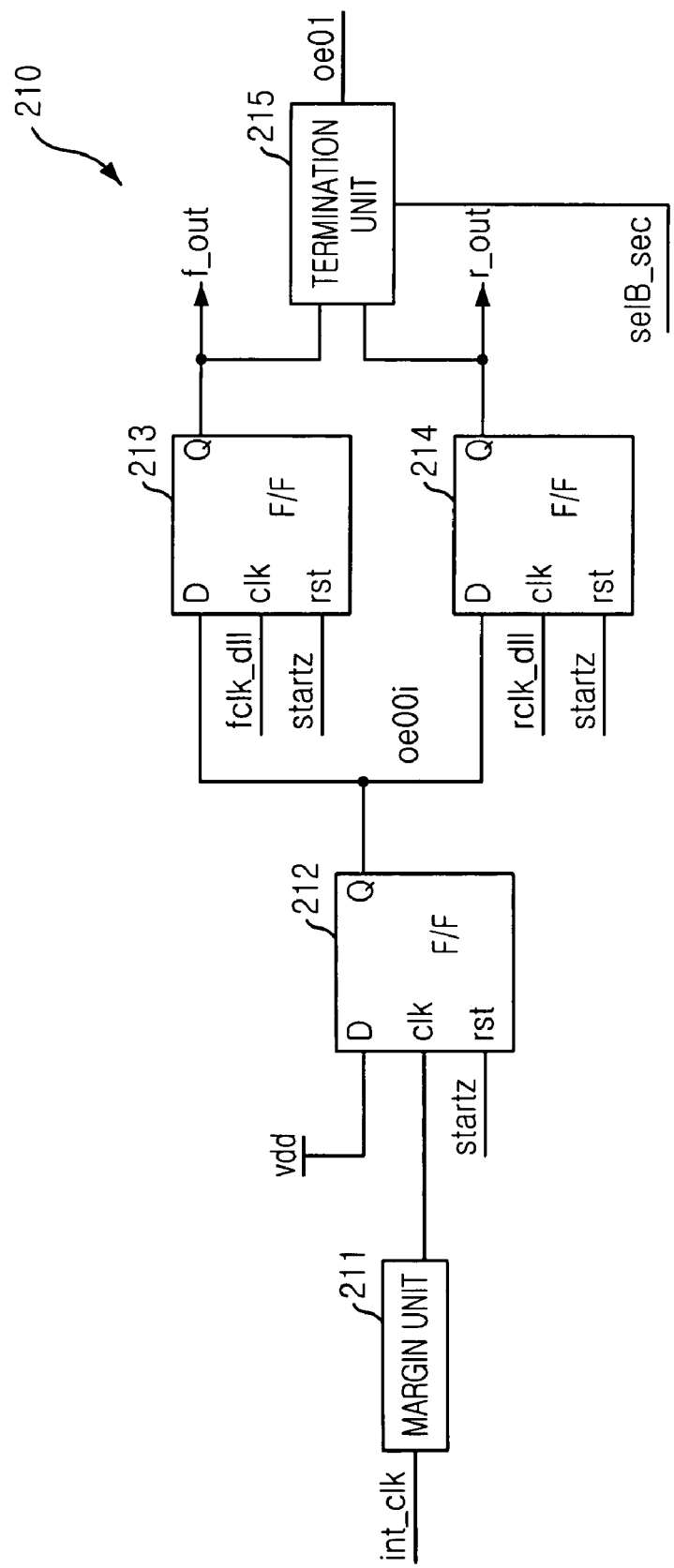
FIG. 13A is a schematic circuit diagram showing a phase detector shown in FIG. 12.

FIG. 13A is a schematic circuit diagram showing the phase detector 210 shown in FIG. 12.

As shown, the phase detector 210 includes a margin unit 211, a first to a third flip-flops 212 to 214 and a termination unit 215.

The margin unit 211 delays the internal clock signal int_clk for a predetermined delay time. The first flip-flop 212 outputs an internal data oe00i in synchronization with the internal clock signal int_clk if the detection starting signal startz is activated.

The second flip-flop 213 synchronizes the internal data oe00i with the falling edge DLL clock signal fclk_dll and outputs the synchronized internal data as the falling clock output signal f_out. Likewise, the third flip-flop 214 synchronizes the internal data oe00i with the rising edge DLL clock signal rclk_dll and outputs the synchronized internal data as the rising clock output signal r_out. The termination unit 215 receives the falling edge DLL clock signal fclk_dll and the rising edge DLL clock signal rclk_dll in order to generate an output data oe01 in response to a second clock selection signal selB_sec.

Figure 1:
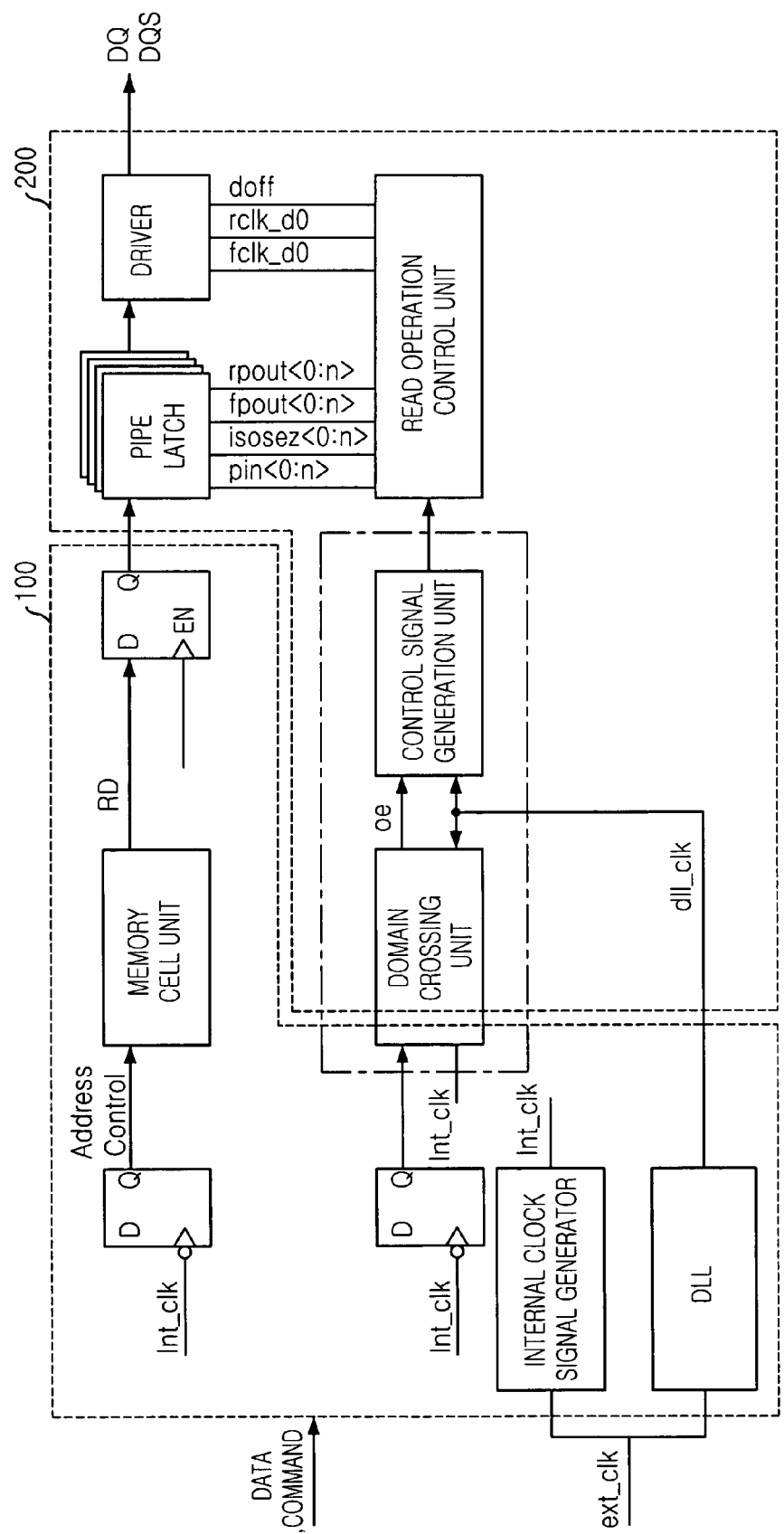
FIG. 1 is a block diagram showing a conventional semiconductor memory device including a domain crossing device.
Figure 2C:
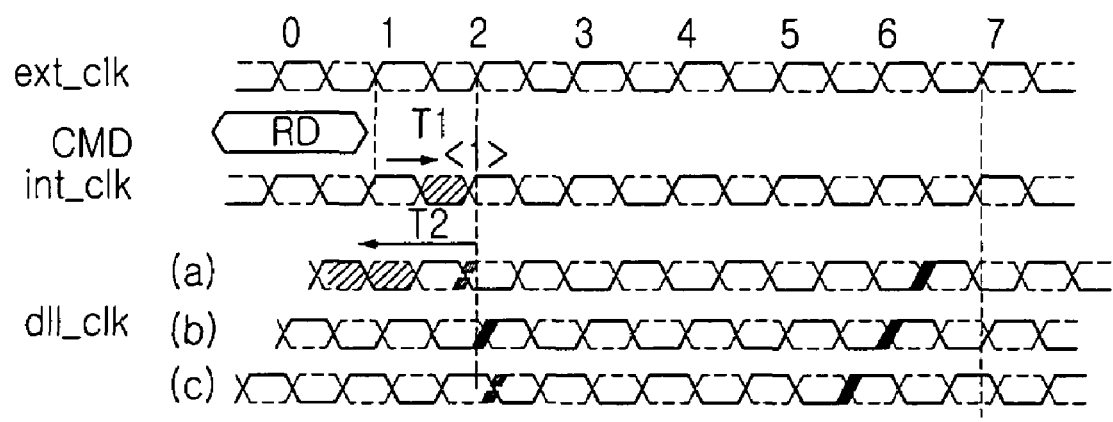
FIG. 2C is a timing diagram showing an operation of a phase detection domain crossing.
Figure 3:
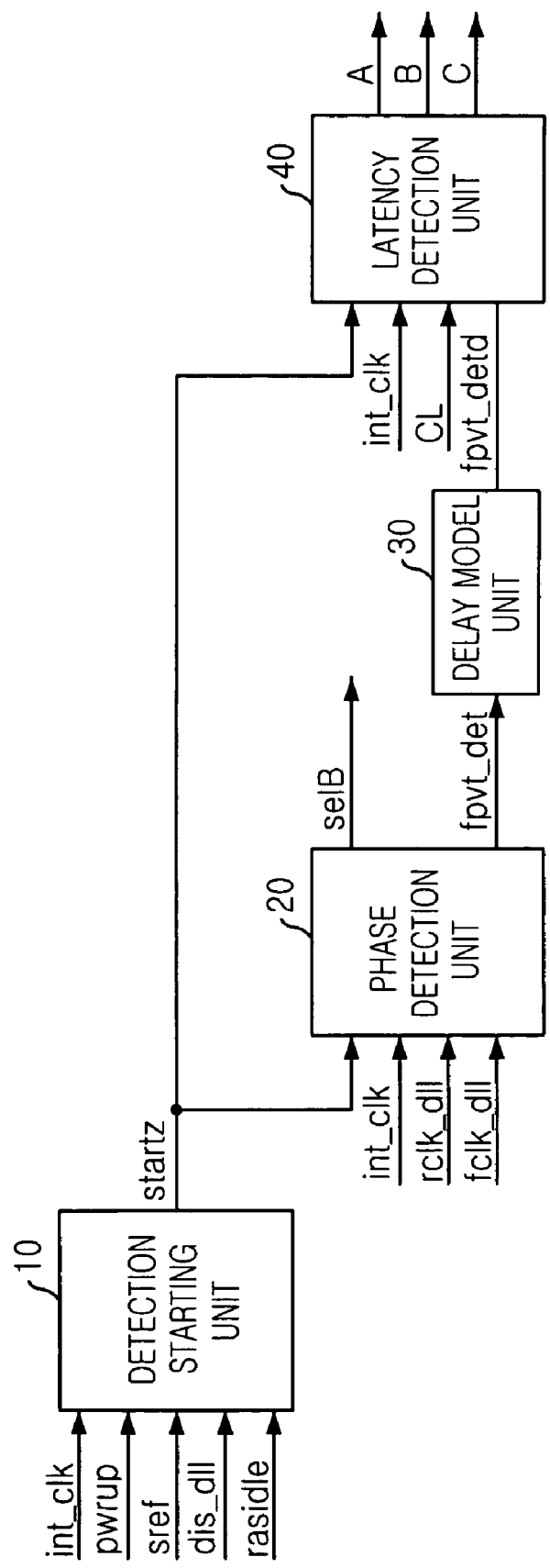
FIG. 3 is a block diagram showing a conventional domain crossing device.
Figure 4:
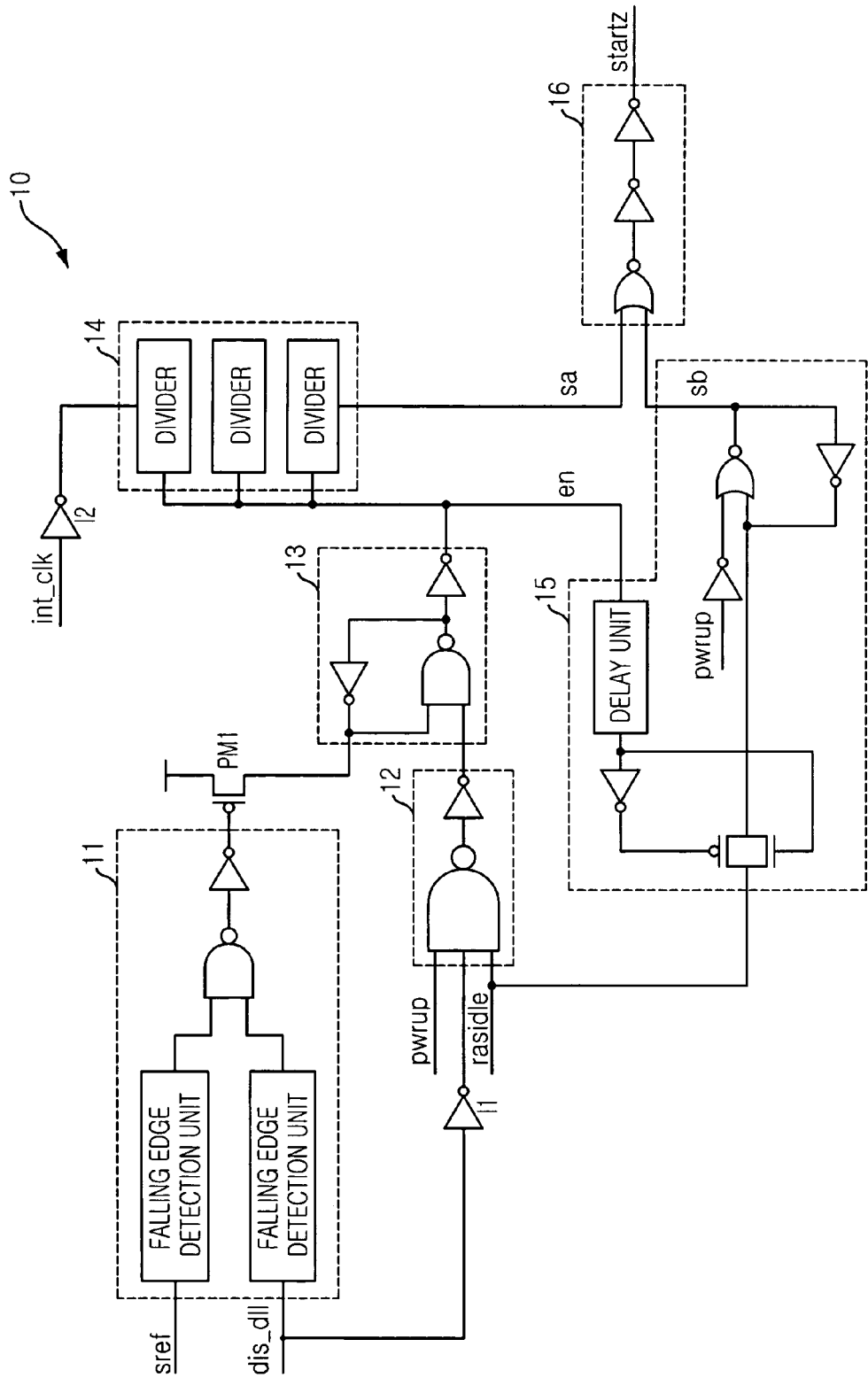
FIG. 4 is a schematic circuit diagram showing a detection starting unit in FIG. 3.
Figure 5:
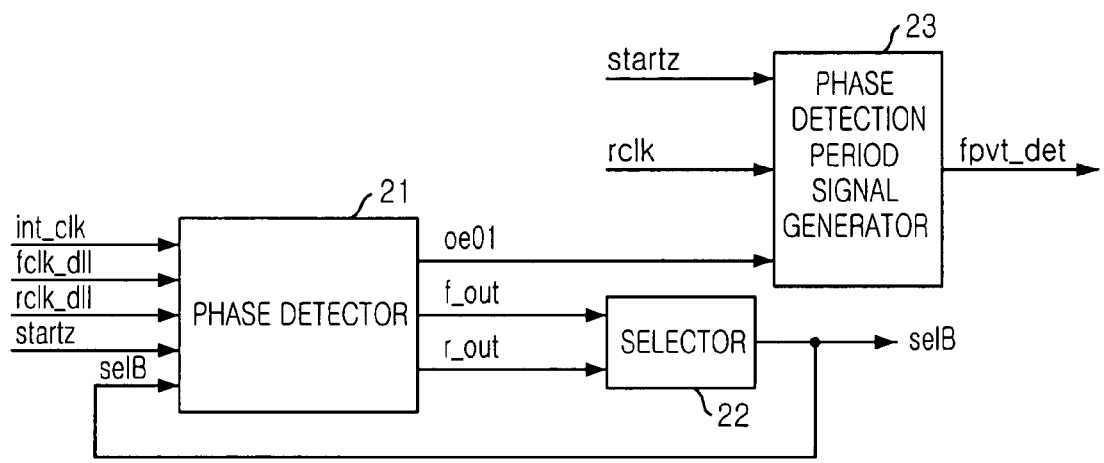
FIG. 5 is a block diagram showing a phase detection unit shown in FIG. 3.
Figure 6A:
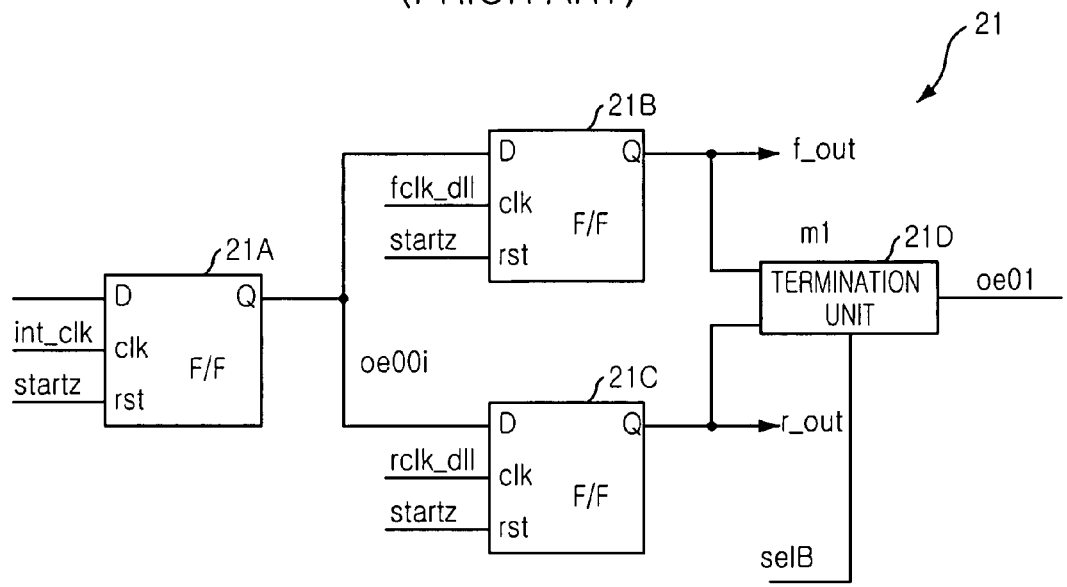
FIG. 6A is a schematic circuit diagram showing a phase detector shown in FIG. 5.

In comparison with the phase detector 21 shown in FIG. 6A, the phase detector 210 delays the internal clock signal int_clk by using the margin unit 211 before inputting the internal clock signal int_clk to the first flip-flop 212.

Since the internal clock signal int_clk is delayed by the margin unit 211, the phase detection operation can be performed under a condition that phase difference between the internal clock signal int_clk and the falling and rising edge DLL clock signals fclk_dll and rclk_dll. Thus, thereafter, even if the phase difference between the internal clock signal int_clk and the falling and rising edge DLL clock signals fclk_dll and rclk_dll is changed, the phase detection operation is stably performed.

Further, since the termination unit 215 generates the output data oe01 in response to the second clock selection signal selB_sec which holds its logic level during the activation period of the detection starting signal startz, the fourth problem PROBLEM4 of the conventional domain crossing device can be solved.

Figure 13B:
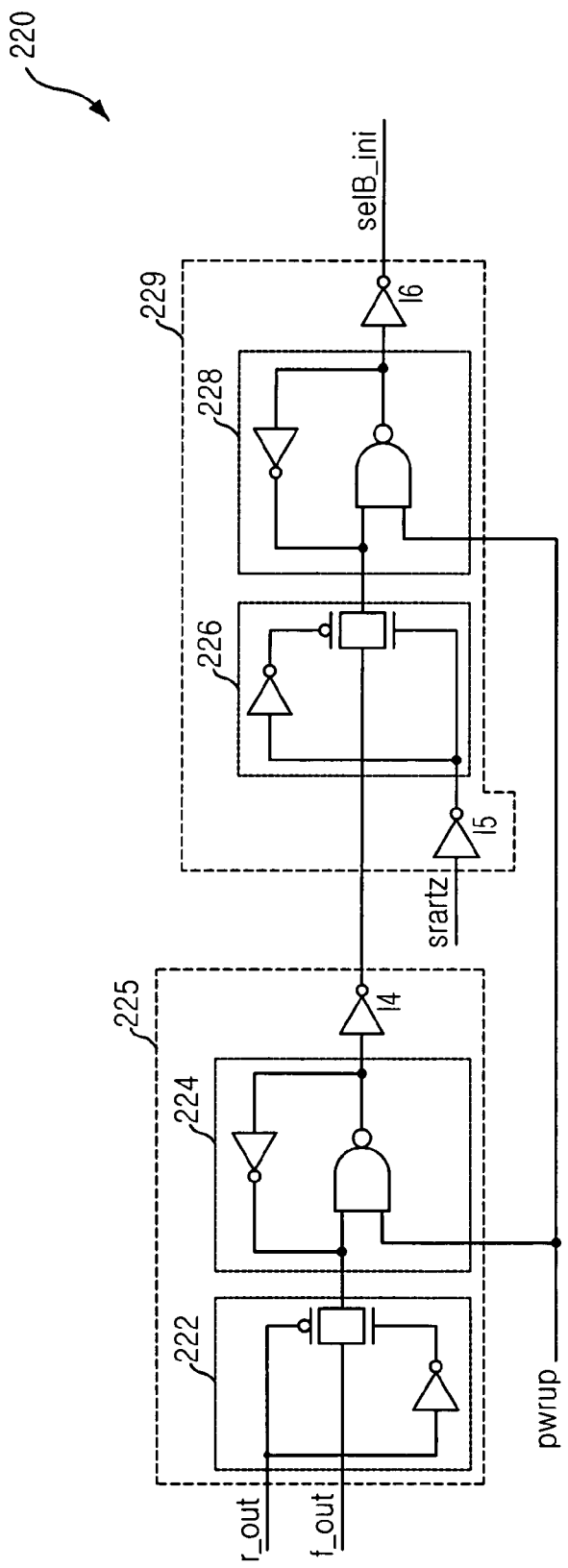
FIG. 13B is a schematic circuit diagram showing a selector shown in FIG. 12.

FIG. 13B is a schematic circuit diagram showing the selector 220 shown in FIG. 12.

As shown, the selector 220 includes a first selector unit 225 and a second selector unit 229.

The first selector unit 225 includes a first transfer gate 222, a first latch 224 and a fourth inverter I4.

The first transfer gate 222 transfers the falling clock output signal f_out to the first latch 224 if the rising clock output signal r_out is inactivated. The first latch 224 latches an output signal of the first transfer gate 222 if the power-up signal pwrup is activated. The fourth inverter I4 inverts an output signal of the first latch 224.

The second selector unit 229 includes a second transfer gate 226, a second latch 228, a fifth inverter I5 and a sixth inverter I6.

The fifth inverter I5 inverts the detection starting signal startz. The second transfer gate 226 transfers an output signal of the first selector unit 225 to the second latch 228 in response to an output signal of the fifth inverter I5. The second latch 228 latches an output signal of the second transfer gate 226 when the power-up signal pwrup is activated. The sixth inverter I6 inverts an output signal of the second latch 228 to output the initial clock selection signal selB_ini.

Figure 6B:
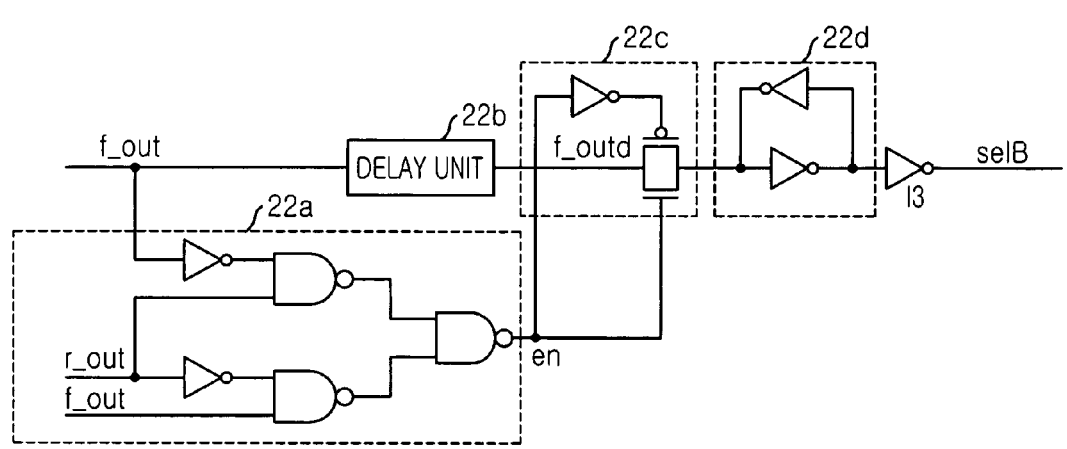
FIG. 6B is a schematic circuit diagram showing a selector shown in FIG. 5.
Figure 6C:
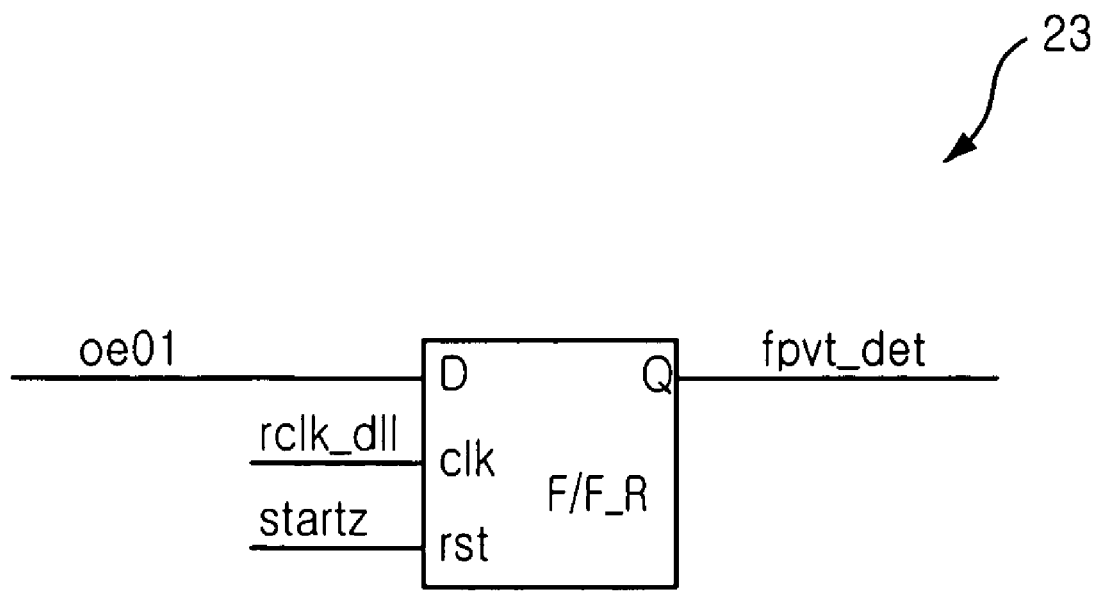
FIG. 6C is a schematic circuit diagram showing a phase detection period signal generator shown in FIG. 5.
Figure 7:
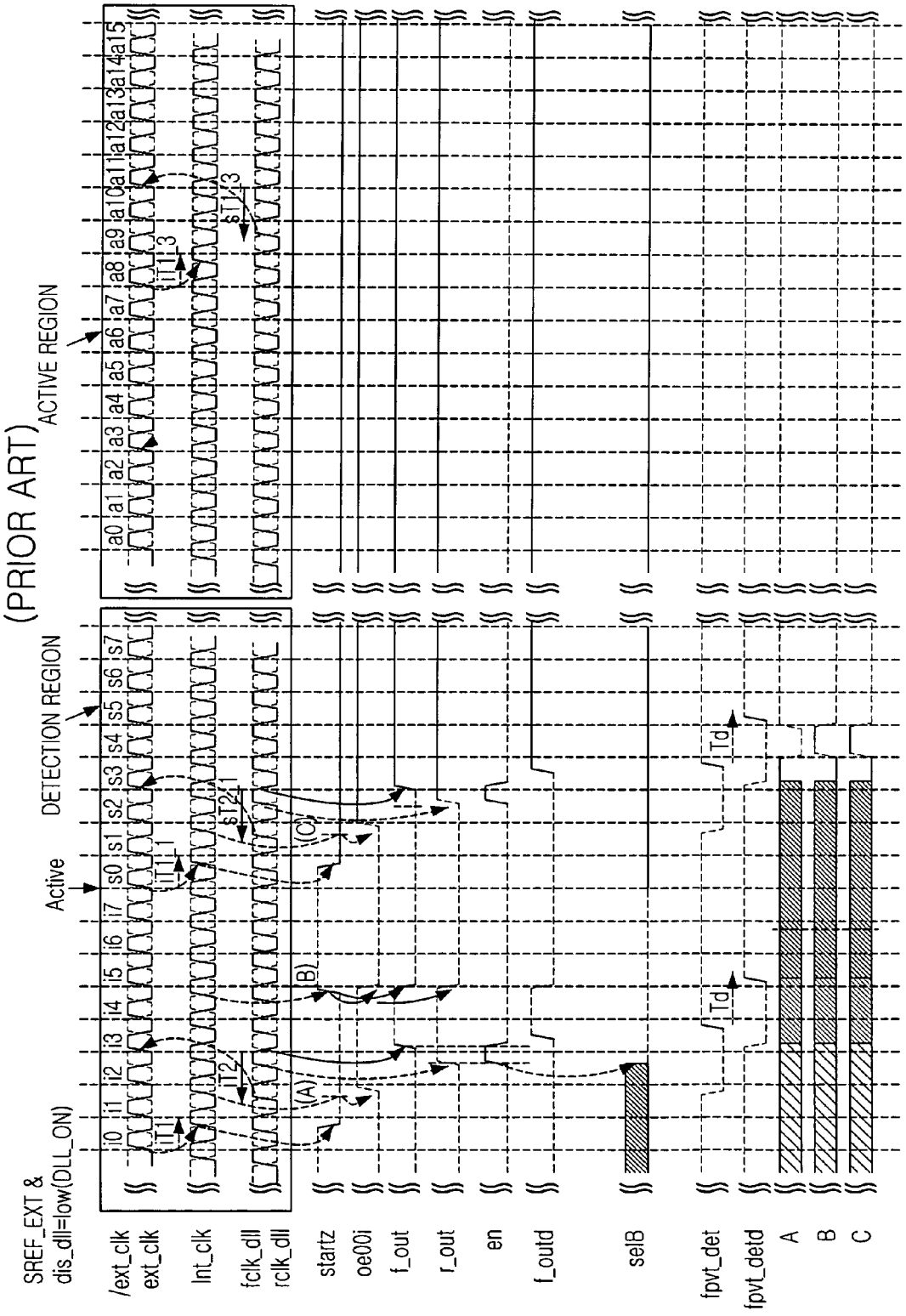
FIG. 7 is a timing diagram showing operations of the conventional domain crossing device shown in FIG. 3.
Figure 8:
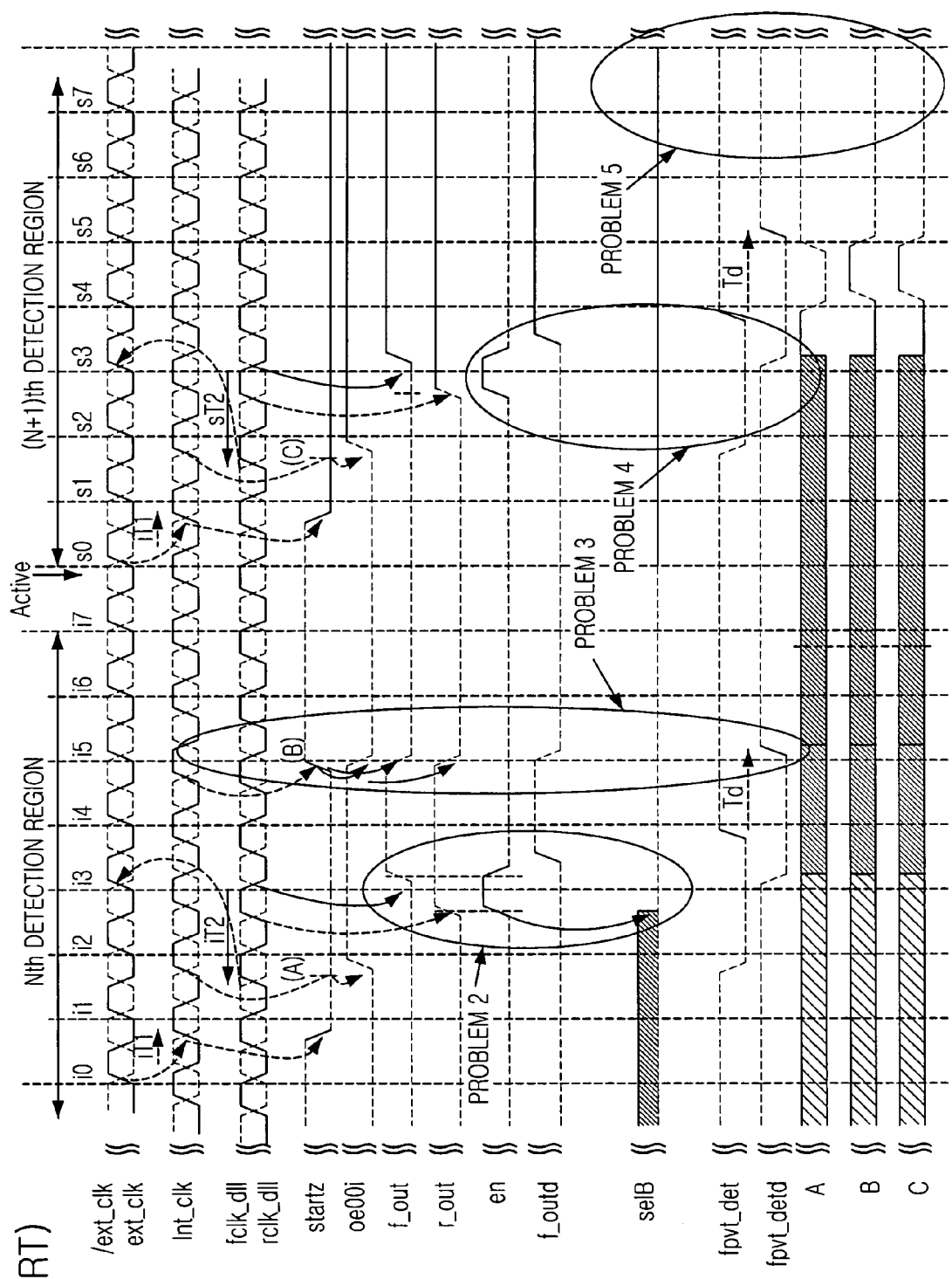
FIG. 8 is a timing diagram showing operational problems of the conventional domain crossing device shown in FIG. 3.
Figure 9A:
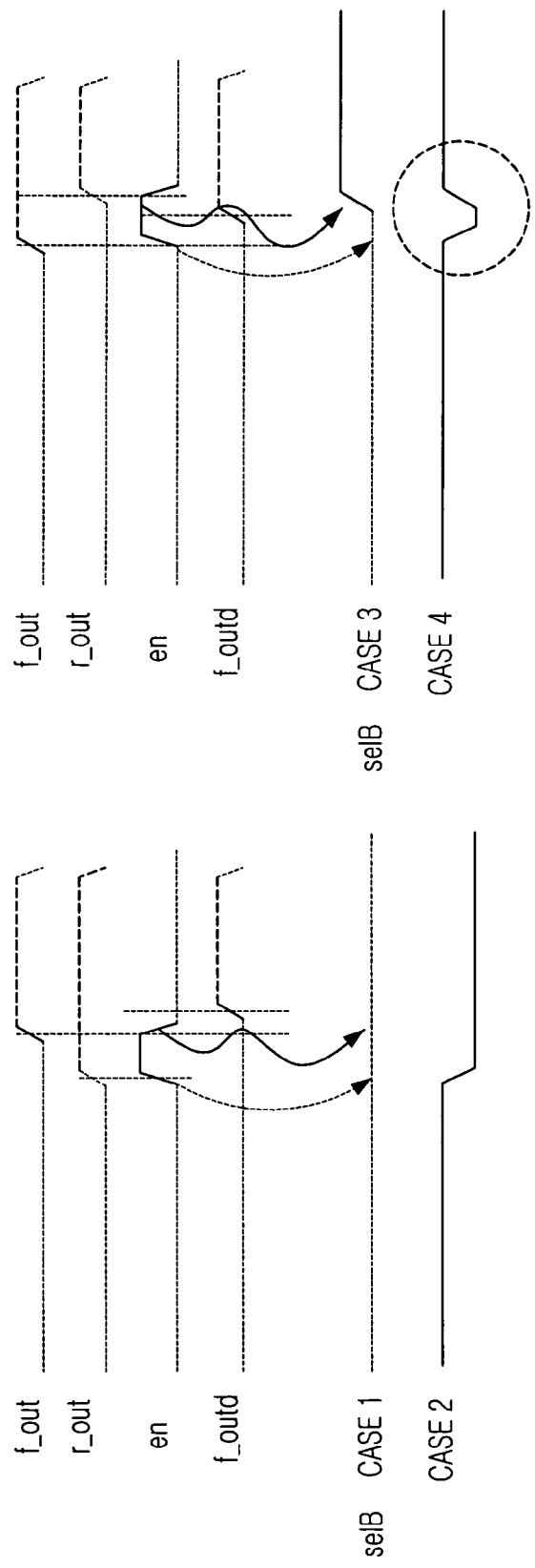
FIG. 9A is a timing diagram showing operations of a selector included in a phase detection unit.
Figure 9B:
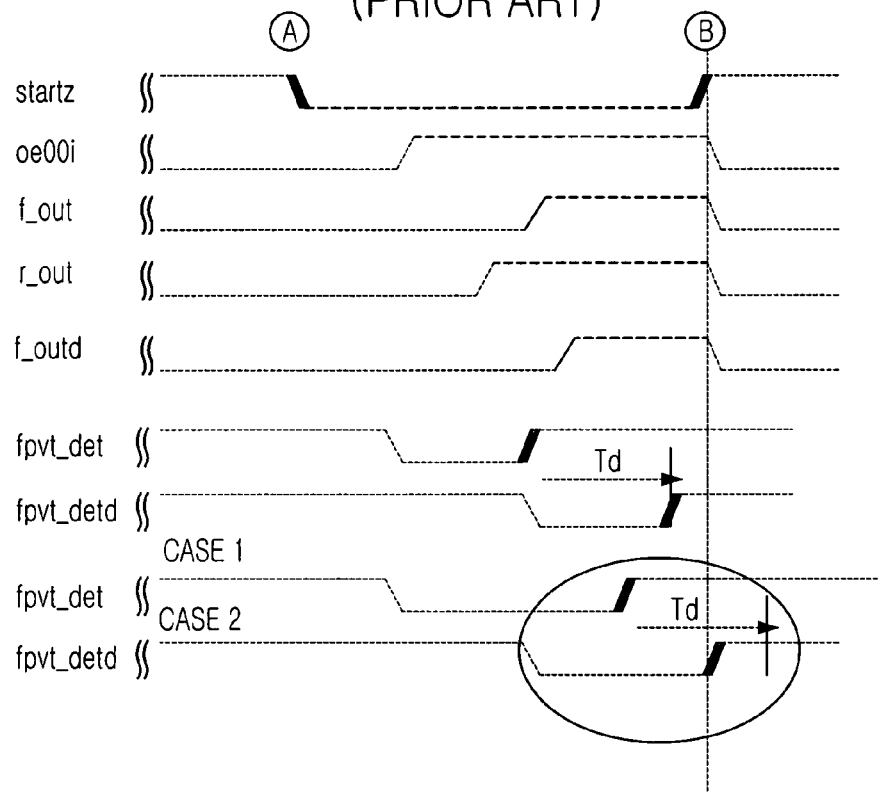
FIG. 9B is a timing diagram showing a third problem of the conventional domain crossing device shown in FIG. 3.
Figure 9C:
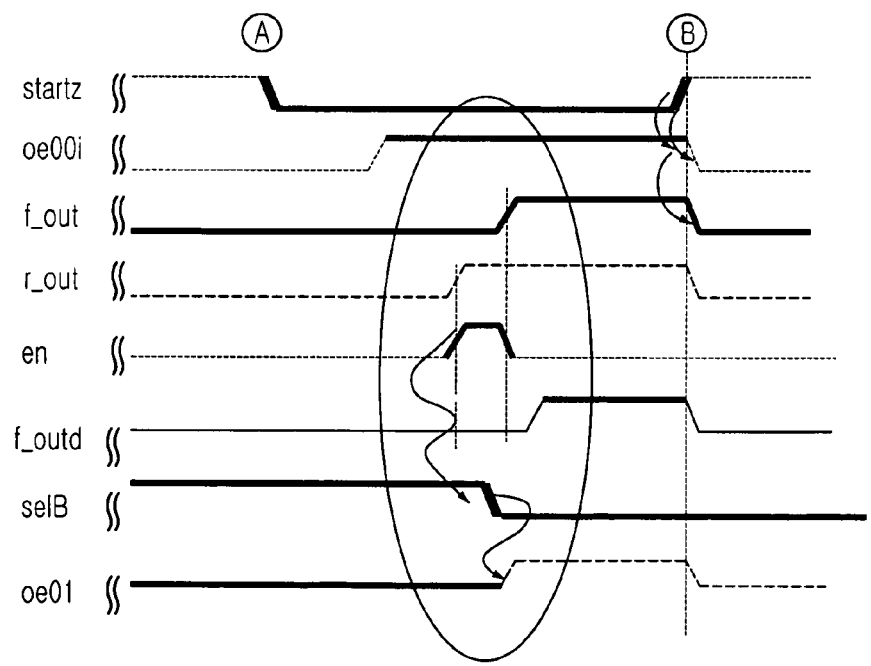
FIG. 9C is a timing diagram showing a fourth problem of the conventional domain crossing device shown in FIG. 3.

In comparison with the selector 22 shown in FIG. 6B, the selector 220 does not generate the enable signal en of the selector 22. Instead, the selector 220 transfers the falling clock output signal f_out at the inactivation period of the rising clock output signal r_out, and then, outputs the falling clock output signal f_out as the initial clock selection signal selB_ini. Accordingly, the second problem PROBLEM2 can be solved.

Figure 13C:
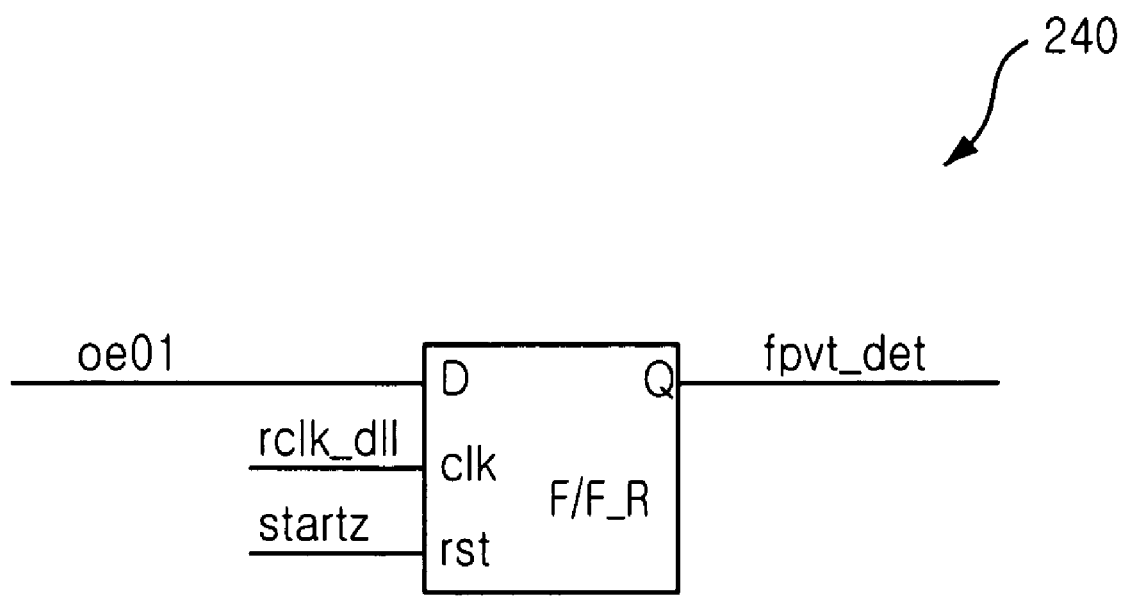
FIG. 13C is a schematic circuit diagram showing a phase detection period signal generator shown in FIG. 12.

FIG. 13C is a schematic circuit diagram showing the phase detection period signal generator 240 shown in FIG. 12.

As shown, the phase detection period signal generator 240 includes a D-type flip-flop. The phase detection period signal generator 240 receives the output data oe01, the rising edge DLL clock signal rclk_dll and the detection starting signal startz respectively through a data input terminal D, a clock input terminal clk and a reset input terminal rst to thereby output the phase detection period signal fpvt_det.

Referring to FIGS. 12 to 13C, operations of the phase detection unit 200 are described below.

If the detection starting signal startz is activated, the phase detector 210 generates the internal data oe00i synchronized with the internal clock signal int_clk. Then, the internal data oe00i is outputted as the falling clock output signal f_out and the rising clock output signal r_out by synchronizing the internal data oe00i with the falling edge DLL clock signal fclk_dll and the rising edge DLL clock signal rclk_dll respectively.

Thereafter, the selector 220 outputs the initial clock selection signal selB_ini selecting earlier activated signal between the falling clock output signal f_out and the rising clock output signal r_out. The termination unit 215 terminates the phase detection operation by activating the output data oe01 in response to the second clock selection signal selB_sec.

Thereafter, the phase detection period signal generator 240 generates the phase detection period signal fpvt_det whose pulse width corresponds to the time period from the activation timing of the detection starting signal startz to the activation timing of the output data oe01.

Figure 14:
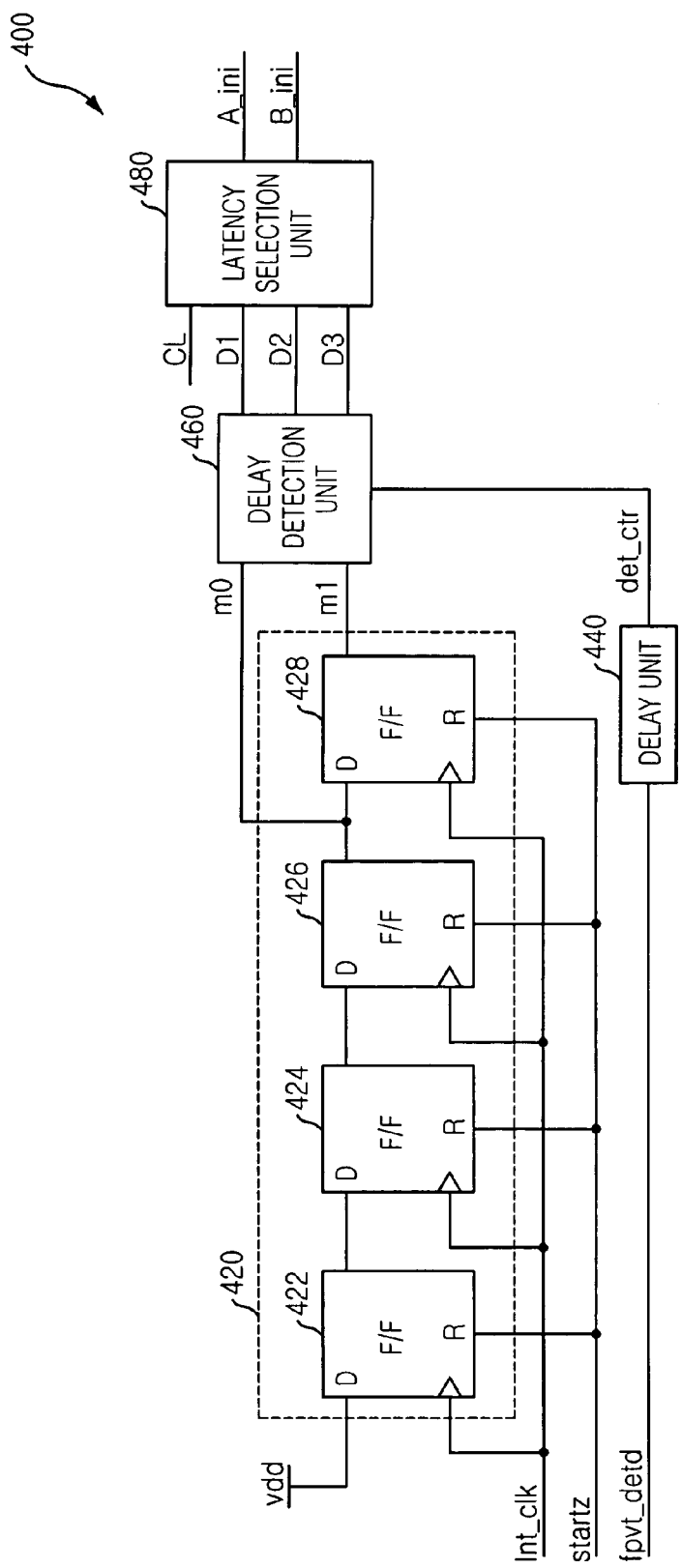
FIG. 14 is a schematic circuit diagram showing a latency detection unit shown in FIG. 10.

FIG. 14 is a schematic circuit diagram showing the latency detection unit 400 shown in FIG. 10.

As shown, the latency detection unit 400 includes a delay signal generator 420, a delay unit 440, a delay detection unit 460 and a latency selection unit 480.

The delay signal generator 420 generates a first and a second delayed signals m0 and m1 in synchronization with the internal clock signal int_clk when the detection starting signal startz is activated. For this operation, the delay signal generator 420 includes a fifth to an eighth flip-flops 422 to 428.

The delay unit 440 delays the delayed phase detection period signal fpvt_detd for a predetermined delay time in order to generate a delay detection control signal det_ctr.

The delay detection unit 460 receives the delay detection control signal det_ctr and the first and the second delay signals m0 and m1 to detect how much a DLL clock signal leads the internal clock signal int_clk. Then, the delay detection unit 460 generates a first to a third latency control signals D1 to D3 based on the detection result.

The latency selection unit 480 generates the first and the second initial latency signals A_ini and B_ini based on the CAS latency signal CL and the first to the third latency control signals D1 to D3.

If the detection starting signal startz is activated, the delay signal generator 420 delays an input signal inputted through the input terminal D by using the fifth to the eighth flip-flops 422 to 428 to thereby output the first and the second delayed signals m0 and m1. Since the first to the eighth flip-flops 422 to 428 are operated in synchronization with the internal clock signal int_clk, the first and the second delayed signals m0 and m1 are outputted in synchronization with the internal clock signal int_clk. The delay unit 440 delays the delayed phase detection period signal fpvt_detd to generate the delay detection control signal det_ctr.

Thereafter, delay detection unit 460 generates the first to the third latency control signals D1 to D3 based on the first and the second delayed signals m0 and m1. Then, the latency selection unit 480 determines an actual CAS latency to be used for outputting data based on the CAS latency signal CL and the first to the third latency control signals D1 to D3 and outputs the first and the second initial latency signals A_ini and B_ini.

Figure 15A:
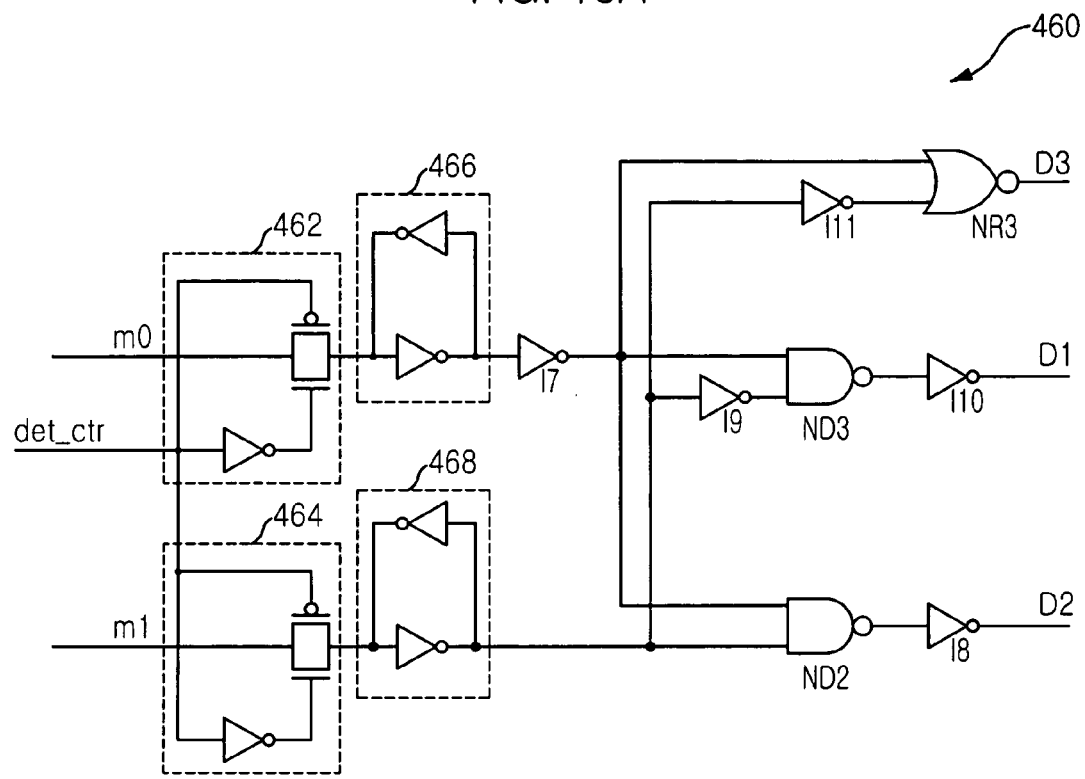
FIG. 15A is a schematic circuit diagram showing a delay detection unit shown in FIG. 14.

FIG. 15A is a schematic circuit diagram showing the delay detection unit 460 shown in FIG. 14.

As shown, the delay detection unit 460 includes a third and a fourth transfer gates 462 and 464, a third and a fourth latches 466 and 468, a seventh to an eleventh inverters I7 to I11, a second and a third NAND gates ND2 and ND3 and a third NOR gate NR3.

The third and the fourth transfer gates 462 and 464 respectively transfer the first and the second delay signals m0 and m1 to the third and the fourth latches 466 and 468 in response to the delay detection control signal det_ctr. The third latch 466 latches an output signal of the third transfer gate 462, and the fourth latch 468 latches an output signal of the fourth transfer gate 464. The seventh inverter I7 inverts an output signal of the third latch 466, and the inverted signal is inputted to the third NAND gate ND3, the third NOR gate NR3 and the second NAND gate ND2. An output signal of the fourth latch 468 is inverted by the ninth and eleventh inverters I9 and I11 to be respectively inputted to the third NAND gate ND3 and the third NOR gate NR3. The eighth and the tenth inverters I8 and I10 respectively receive output signals of the second NAND gate ND2 and the third NOR gate ND3 to thereby output the second and the first latency control signals D2 and D1. The third NOR gate NR3 performs a logic NOR operation to output signals of the seventh and the eleventh inverters I7 and I11 to thereby output the third latency control signals.

Figure 15B:
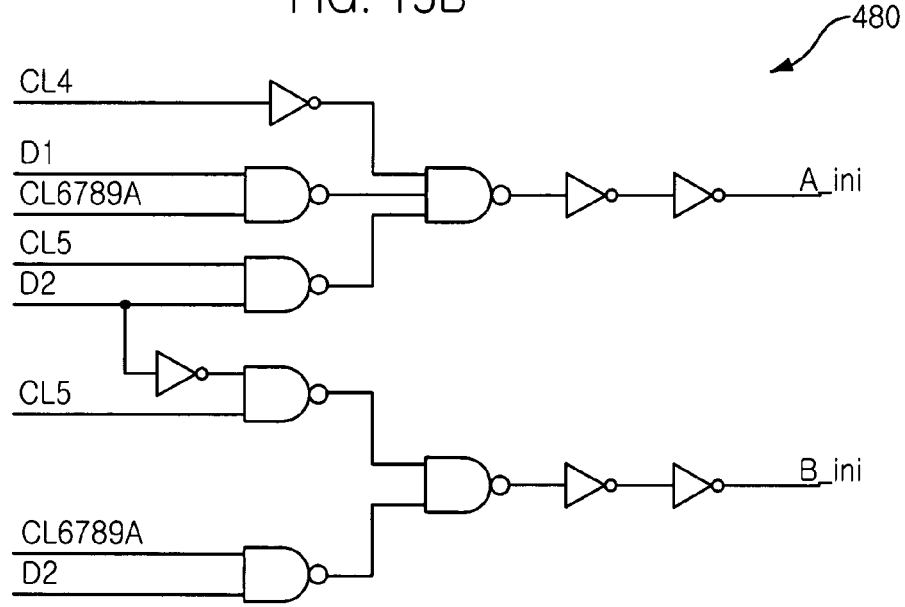
FIG. 15B is a schematic circuit diagram showing a latency selection unit shown in FIG. 14.

FIG. 15B is a schematic circuit diagram showing the latency selection unit 480 shown in FIG. 14. Herein, the CAS latency signal CL shown in FIG. 13 includes a first to a third CAS latency signals CL4, CL6789A and CL5.

The latency selection unit 480 controls the CAS latency signal CL in response to the first to the third latency control signals D1 to D3 to thereby output the first and the second initial latency signals A_ini and B_ini.

Figure 16:
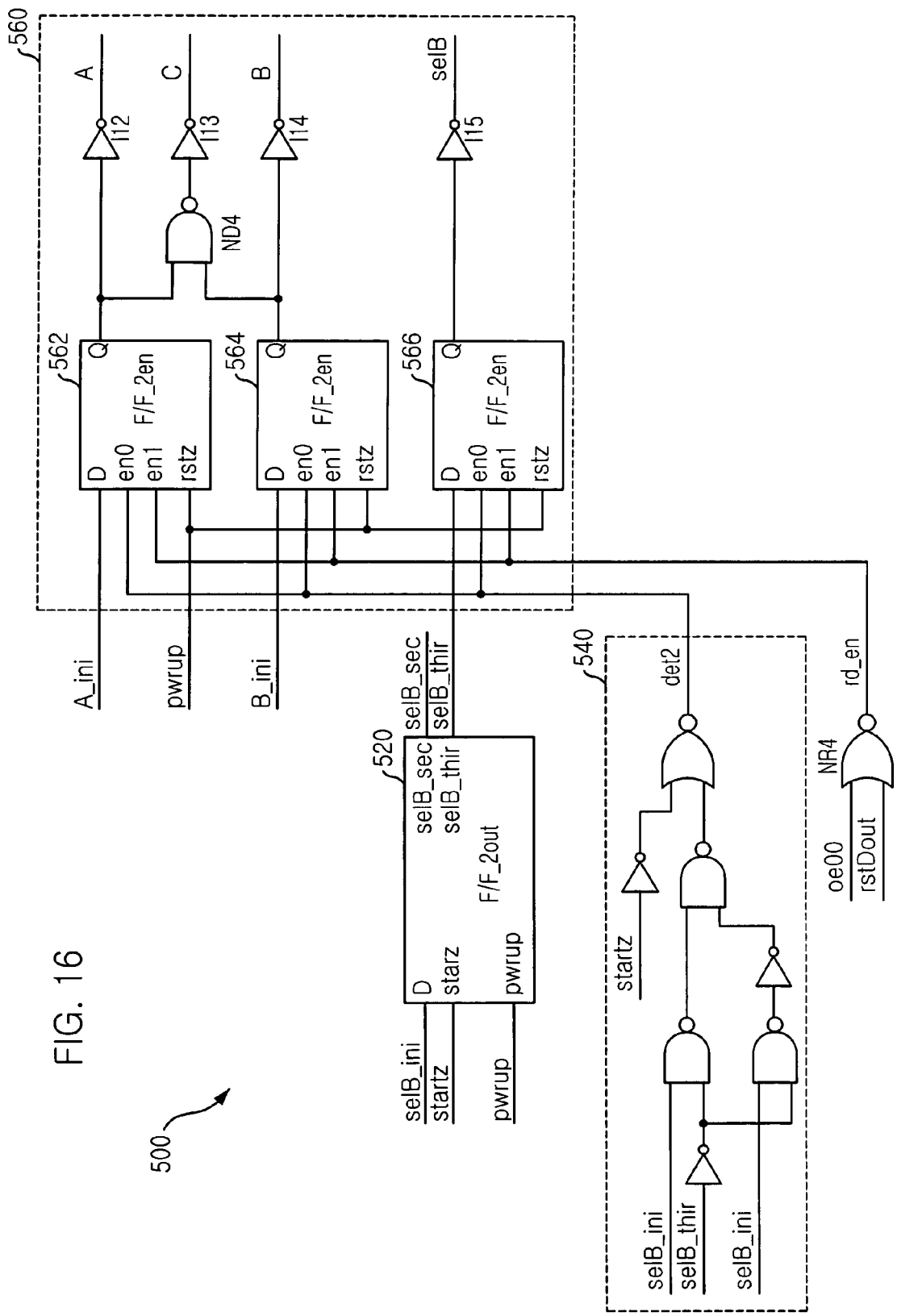
FIG. 16 is a schematic circuit diagram showing a detection result output unit shown in FIG. 10.

FIG. 16 is a schematic circuit diagram showing the detection result output unit 500 shown in FIG. 10.

As shown, the detection result output unit 500 includes a holding unit 520, a comparison unit 540 and an output unit 560.

The holding unit 520 outputs the initial clock selection signal selB_ini as the second clock selection signal selB_sec when the detection starting signal startz is in a logic high level. On the contrary, when the detection starting signal startz is in a logic low level, the holding unit 520 outputs the second clock selection signal selB_sec generated at a previous activation period of the detection starting signal startz as a third clock selection signal selB_thir. The comparison unit 540 compares the initial clock selection signal selB_ini with the third clock selection signal selB_thir when the detection starting signal startz is in a logic high level to thereby output a determination signal det2 based on the comparison result. The output unit 560 generates the first to the third latency signals A to C and the selection signal selB in response to the determination signal det2 and a read enable signal rd_en.

Herein, the read enable signal rd_en is generated by performing a logic NOR operation to a data output signal rstDout and an output activation signal oe00. The data output signal rstDout is inactivated during the read operation and is activated while the read operation is not performed. The output activation signal oe00 is inactivated when a data is outputted. Therefore, the read enable signal rd_en is inactivated while the data is outputted by the read operation.

In addition, the output unit 560 includes a ninth to an eleventh flip-flops 562 to 566, a twelfth to a fifteenth inverters I12 to I15 and a fourth NAND gate ND4.

Each of the ninth to the eleventh flip-flops 562 to 566 receives the determination signal det2, the read enable signal rd_en and the power-up signal pwrup. The ninth to the eleventh flip-flops 562 to 566 respectively receive the first initial latency signal A_ini, the second initial latency signal B_ini and the third clock selection signal selB_thir. The twelfth to the fourteenth inverters respectively output the first latency signal A, the third latency signal C and the second latency signal B. The fifteenth inverter I15 outputs the selection signal selB.

An operation of the detection result output unit 500 is described below.

The holding unit 520 outputs the initial clock selection signal selB_ini detected at an Nth detection region as the second clock selection signal selB_sec at the activation period of the detection starting signal startz. Thereafter, at an (N+1)th detection region where the detection starting signal startz is in a logic low level, the holding unit 520 outputs a previous second clock selection signal as the third clock selection signal selB_thir. Thereafter, during the activation timing of the detection starting signal, the comparison unit 540 compares the initial clock selection signal selB_ini generated at the (N+1)th detection region with the third clock selection signal selB_thir generated at the Nth detection region. If the initial clock selection signal selB_ini and the third clock selection signal selB_third are the same, the comparison unit 540 activates the determination signal det2. Thereafter, the output unit 560 outputs the third clock selection signal selB_thir as the selection signal selB and also outputs the first initial latency signal A_ini and the second initial latency signal B_ini as the first to the third latency signals A to C when both of the determination signal det2 and the read enable signal rd_en are activated.

Therefore, the detection result output unit 500 outputs the selection signal selB and the first to the third latency signals A to C only if same clock selection signal is generated at consecutive detection regions.

In addition, the detection result output unit 500 does not output the result of the detection operation while the data is outputted according to the read operation. That is, since abnormal operations may be performed by applying the result of the detection operation while the data is outputted, the detection result output unit 500 outputs the result of the detection operation under control of the read activation signal rd_en. Further, since the determination signal det2 and the read activation signal rd_en are used as enable signals respectively inputted to a first enable signal input terminal en0 and a second enable signal input terminal en1 for the ninth to the eleventh flip-flops 562 to 566 in order to generate the selection signal selB and the first to the third latency signals A to C, the fifth problem PROBLEM5 of the conventional domain crossing device is not happened.

Figure 17A:
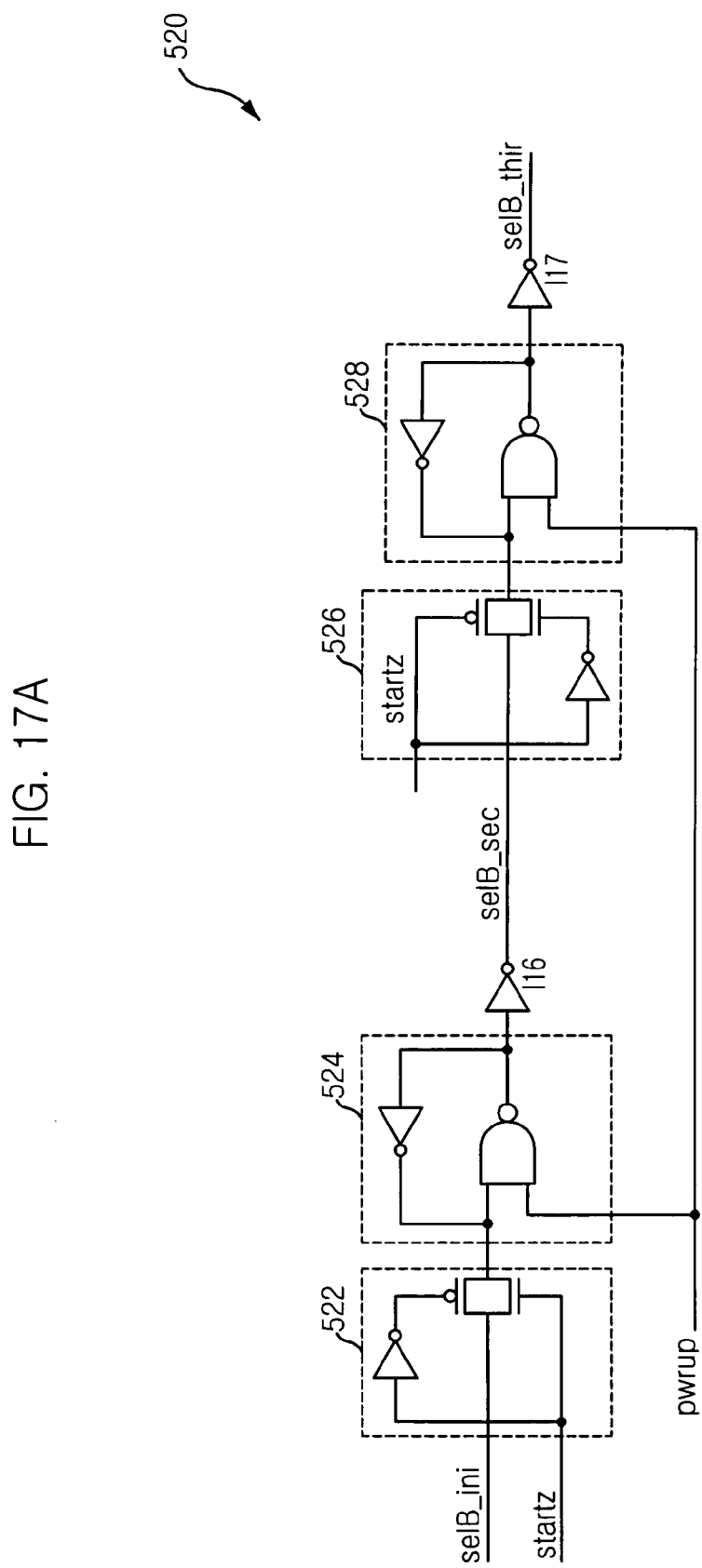
FIG. 17A is a schematic circuit diagram showing a holding unit shown in FIG. 16.

FIG. 17A is a schematic circuit diagram showing the holding unit 520 shown in FIG. 16.

As shown, the holding unit 520 includes a fifth transfer gate 522, a sixth transfer gate 526, a fifth latch 524, a sixth latch 528, a sixteenth and a seventeenth inverters I16 and I17.

The fifth transfer gate 522 transfers the initial clock selection signal selB_ini to the fifth latch 524 in response to the detection starting signal startz and the fifth latch 524 latches an output signal of the fifth transfer gate 522. The sixteenth inverter I16 inverts an output signal of the fifth latch 524 to output the second clock selection signal selB_sec. The sixth transfer gate 526 transfers the second clock signal selB_sec outputted from the sixteenth inverter I16 to the sixth latch 528 in response to the detection starting signal startz and the sixth latch 528 latches an output signal of the sixth transfer gate 526. The seventeenth inverter I17 inverts an output signal of the sixth latch 528 to output the third clock selection signal selB_thir.

That is, after a first detection operation, the initial detection signal selB_ini is outputted as the second clock selection signal selB_sec. Thereafter, after a second detection operation, the second clock selection signal selB_sec is outputted as the third clock selection signal selB_thir.

Figure 17B:
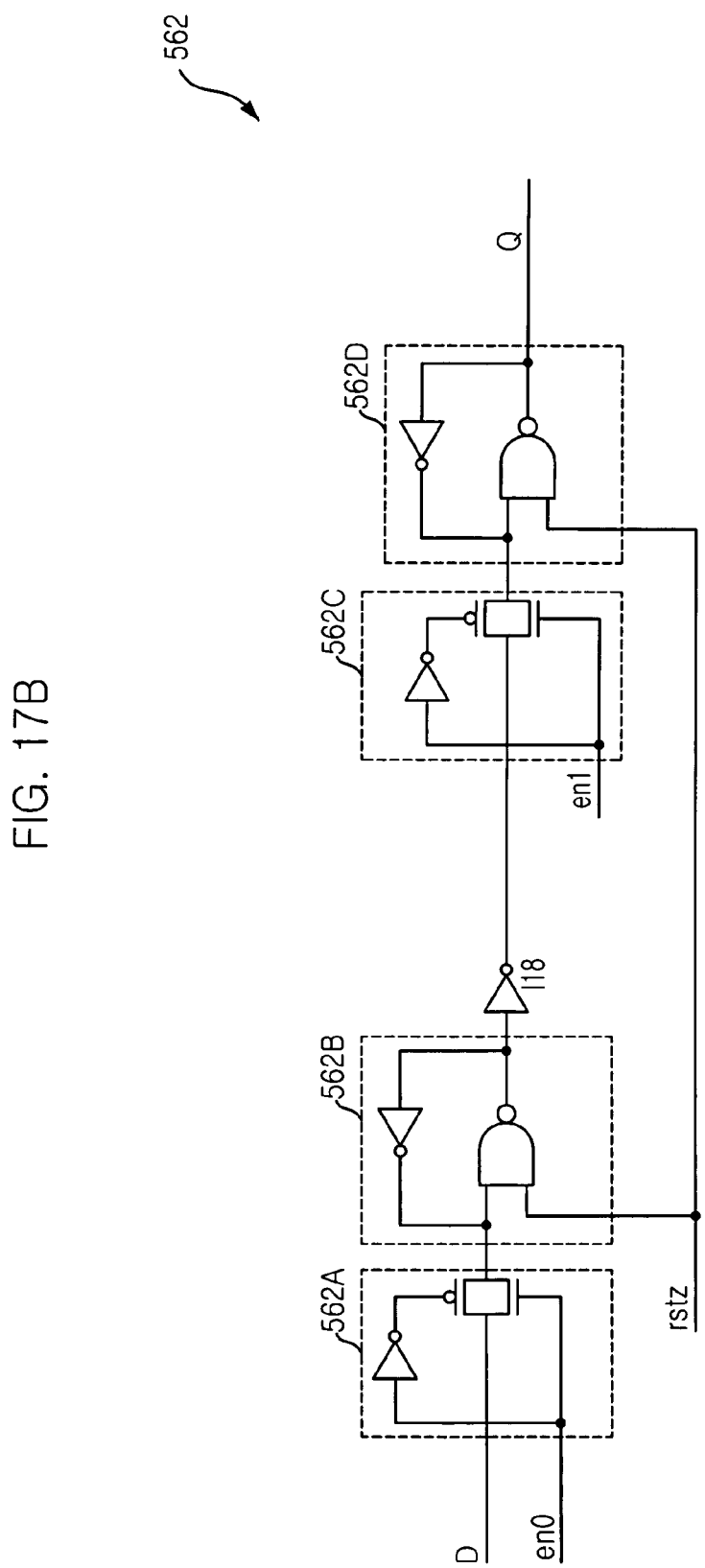
FIG. 17B is a schematic circuit diagram showing a ninth flip-flop included in an output unit shown in FIG. 16.

FIG. 17B is a schematic circuit diagram showing the ninth flip-flop 562 included in the output unit 560 shown in FIG. 16. Since each of the tenth and the eleventh flip-flops 564 and 566 has the same structure with the ninth flip-flop 562, detailed descriptions of the tenth and the eleventh flip-flops 564 and 566 are omitted.

As shown, the ninth flip-flop 562 includes a seventeenth transfer gate 562A, an eighth transfer gate 562C, a seventh latch 562B, an eighth latch 562D and an eighteenth inverter I18.

A data input terminal D receives the first initial latency signal A_ini. The first and the second enable signal input terminals en0 and en1 respectively receive the determination signal det2 and the read activation signal rd_en. A reset signal input terminal rstz receives the power-up signal pwrup. Since structures and operations of the seventh transfer gate 562A, the eighth transfer gate 562C, the seventh latch 562B, the eighth latch 562D are same to those of the fifth transfer gate 522, the sixth transfer gate 526, the fifth latch 524 and the sixth latch 528 respectively, detailed descriptions for the seventh transfer gate 562, the eighth transfer gate 562C, the seventh latch 562B, the eighth latch 562D are omitted.

Figure 18:
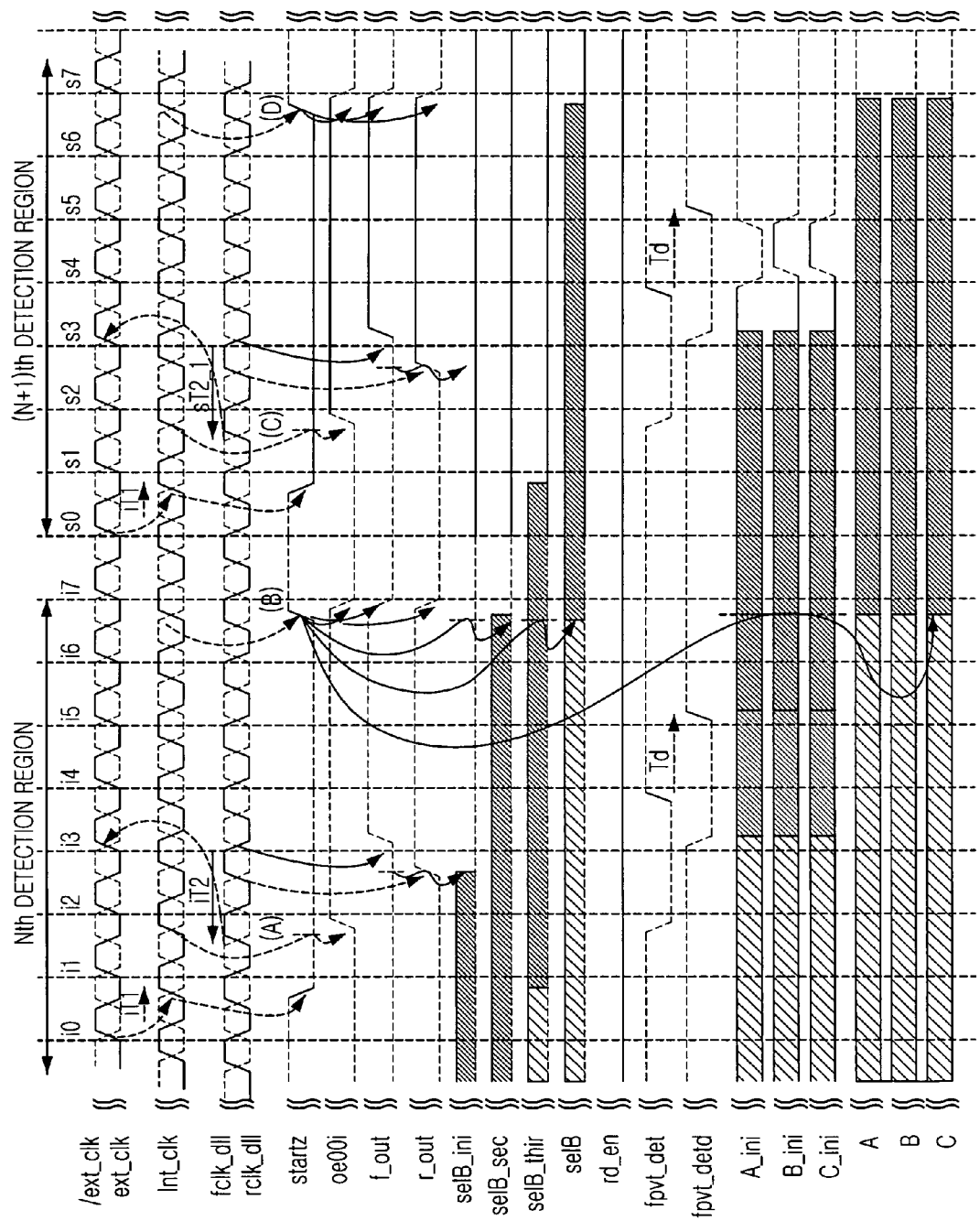
FIG. 18 is a timing diagram showing operations of the domain crossing device.

FIG. 18 is a timing diagram showing operations of the domain crossing device.

Referring to FIG. 10 to 18, the operations of the domain crossing device are described below.

The detection starting unit 100 generates the detection starting signal startz when the self refresh signal sref and the DLL disable signal dis_dll are inactivated. Herein, it is assumed that the domain crossing device is in an Nth detection region.

Thereafter, the phase detector 210 generates the internal clock signal oe00i synchronized with the internal clock signal int_clk. Then, the phase detector 210 synchronizes the internal clock signal oe00i with the falling edge DLL clock signal fclk_dll and the rising edge DLL clock signal rclk_dll to generate the falling clock output signal f_out and the rising clock output signal r_out respectively. Thereafter, the selctor 220 selects one of the falling clock output signal f_out and the rising clock output signal r_out in order to generate the initial clock selection signal selB_ini, wherein the selected signal is activated earlier than the other.

Meanwhile, the termination unit 215 activates the output data oe01 in response to the second clock selection signal selB_sec to thereby terminate the phase detection operation. Thereafter, the phase detection period signal generator 240 generates the phase detection period signal fpvt_det whose pulse width corresponds to a time period from a timing of activating the detection starting signal startz to a timing of activating the output data oe01.

Thereafter, the delay model unit 300 delays the phase detection period signal fpvt_det for a predetermined delay time to thereby output the delayed phase detection period signal fpvt_detd.

The latency detection unit 400 generates the first and the second initial latency signals A_ini and B_ini based on the delayed phase detection period signal fpvt_detd and the CAS latency signal CL.

Thereafter, when the detection starting signal startz is inactivated, the holding unit 520 output the initial clock selection signal selB_ini generated at the Nth detection region as the second clock selection signal selB_sec, and the comparison unit 540 compares the third clock selection signal selB_thir generated at (N−1)th detection region with the initial clock selection signal selB_ini generated at the Nth detection region to activate the determination signal det2. Therefore, the output unit 560 outputs the third clock selection signal selB_thir detected at the Nth detection region and the first and the second initial latency signals A_ini and B_ini as the first to the third latency signals A to C and the selection signal selB.

The above-mentioned operations are the same at an (N+1)th detection region.

Figure 19:
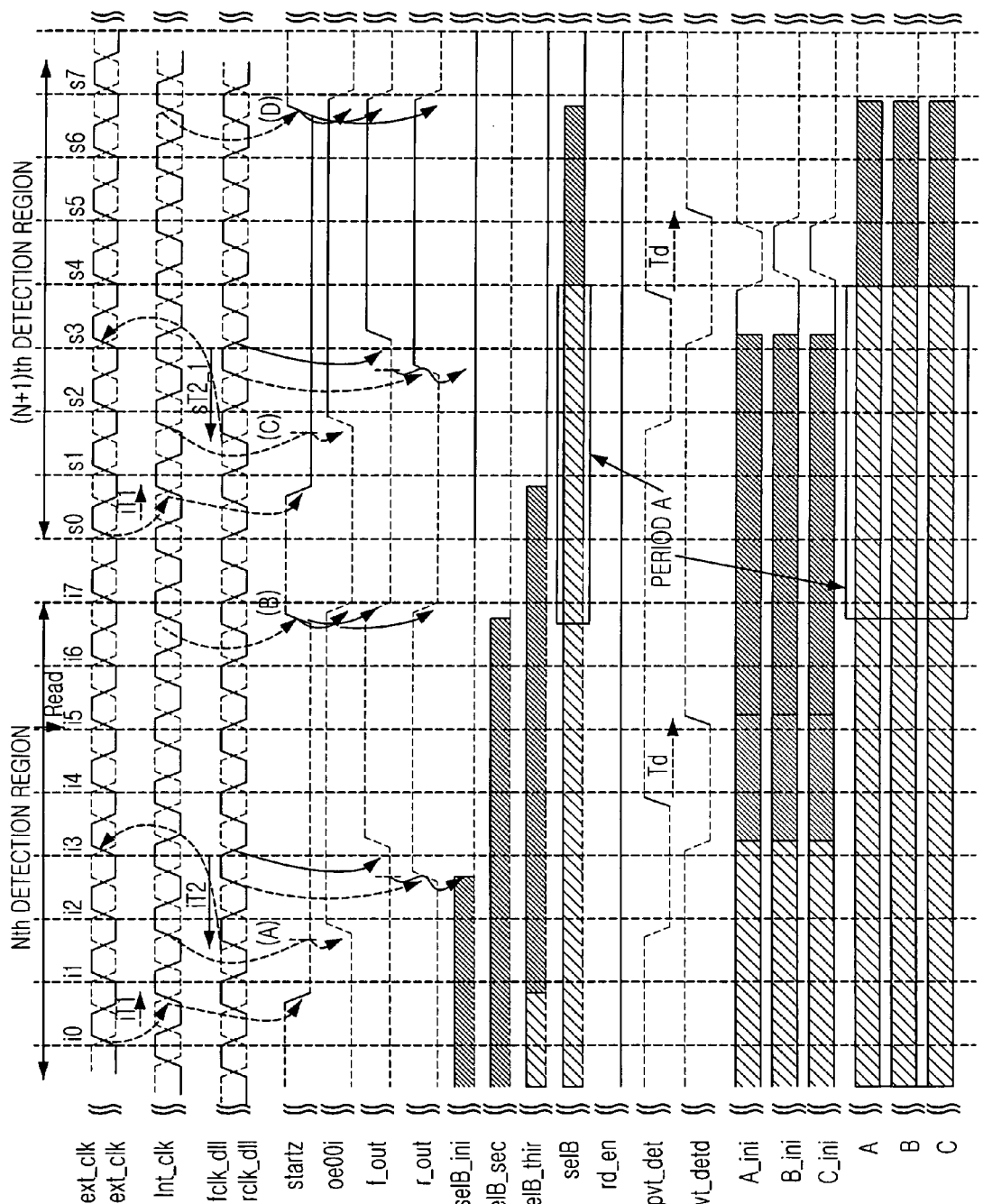
FIG. 19 is another timing diagram showing operations of the domain crossing device.

FIG. 19 is a timing diagram showing operations of the domain crossing device, wherein a read operation is performed during the detection region.

In comparison with the operations of FIG. 18, the detection operation shown in FIG. 19 is the same as that of FIG. 18.

Meanwhile, since a read command is inputted during the Nth detection region, a result of the Nth detection region is not outputted at an inactivation period of the detection starting signal startz of the (N+1)th detection region. Thereafter, after the read operation is completed, the selection signal selB and the first to the third latency signals A to C are outputted. The "PERIOD A" shown in FIG. 19 is a period where the the selection signal selB and the first to the third latency signals A to C cannot be outputted due to the read operation.

As described above, in accordance with the present invention, the domain crossing is stably performed regardless of variations of process, voltage and temperature.

What is claimed is:

1. A domain crossing device for use in a semiconductor memory device, comprising:
   a means for comparing a phase of an internal clock signal with a phase of a delay locked loop (DLL) clock signal to generate a first clock selection signal and a phase detection period signal in response to a detection starting signal and a second clock selection signal;
   a means for generating a plurality of initial latency signals in response to the phase detection period signal, the detection starting signal and a column address strobe (CAS) latency signal;
   a means for receiving the plurality of initial latency signals and the detection starting signal to generate a plurality of latency signals, a clock selection signal and the second clock selection signal; and
   a means for generating the detection starting signal based on a self refresh signal, a power-up signal and a DLL disable signal.

2. The domain crossing device as recited in claim 1, wherein the means for generating the detection starting signal generates the detection starting signal having a constant period after a self refresh operation is performed or a DLL is disabled when the power-up signal is activated.

3. The domain crossing device as recited in claim 2, wherein the means for generating the detection starting signal includes:
   an enable signal generating unit for generating an enable signal based on the power-up signal, the self refresh signal and the DLL disable signal;
   a divider unit for controlling a period of the detection starting signal by dividing the internal clock signal in response to the enable signal;
   a detection period extension unit for extending an activation period of the detection starting signal by delaying the enable signal; and
   an output unit for receiving an output signal of the divider unit and an output signal of the detection period extension unit to generate the detection starting signal.

4. The domain crossing device as recited in claim 3, wherein the enable signal generating unit includes:
   a first NOR gate for receiving the self refresh signal and the DLL disable signal;
   a first NAND gate for receiving an output signal of the first NOR gate and the power-up signal; and
   an inverter for inverting an output signal of the first NAND gate to output the enable signal.

5. The domain crossing device as recited in claim 4, wherein the output unit includes:
   a second NOR gate for receiving the output signal of the divider unit and the output signal of the detection period extension unit; and
   a plurality of inverters connected in series for delaying an output signal of the second NOR gate to generate the detection starting signal.

6. The domain crossing device as recited in claim 5, wherein the detection period extension unit includes a plurality of flip-flops for delaying the enable signal or a delay element which is operated not being synchronized with a clock signal.

7. The domain crossing device as recited in claim 1, wherein the means for comparing a phase of an internal clock signal with a phase of the DLL clock signal includes:
   a detection unit for selecting one of a falling clock signal and a rising clock signal of the DLL clock signal which is more synchronized with the internal clock signal than the other when the detection starting signal is activated; and
   a phase detection period signal generator for generating the phase detection period signal whose pulse width corresponds to a time period from a timing of activating the detection starting signal to a timing of terminating a phase detection operation of the detection unit.

8. The domain crossing device as recited in claim 7, wherein the detection unit includes:
   a phase detector for generating an internal data in synchronization with the internal clock signal and generating a falling clock output signal and a rising clock output signal by synchronizing the internal data with the falling clock signal and the rising clock signal respectively when the detection starting signal is activated; and
   a selector for selecting one of the falling clock output signal and the rising clock output signal which is activated earlier than the other.

9. The domain crossing device as recited in claim 8, wherein the phase detector includes:
   a margin unit for delaying the internal clock signal;
   a first flip-flop for outputting the internal data in synchronization with an output signal of the margin unit;
   a second flip-flop for outputting the internal data as the falling clock output signal in synchronization with the falling clock signal;
   a third flip-flop for outputting the internal data as the rising clock output signal in synchronization with the rising clock signal; and
   a termination unit for selectively outputting the falling clock output signal and the rising clock output signal.

10. The domain crossing device as recited in claim 9, wherein the selector includes:
    a first selector unit for transferring an output signal of the second flip-flop when the power-up signal is activated; and
    a second selector unit for outputting an output signal of the first selector as the first clock selection signal in response to an output signal of the third flip-flop when the power-up signal is activated.

11. The domain crossing device as recited in claim 10, wherein the first selector unit includes:
    a first transfer gate for transferring an output signal of the second flip-flop;
    a first latch for latching an output signal of the first transfer gate; and
    a first inverter for inverting an output signal of the first latch.

12. The domain crossing device as recited in claim 11, wherein the second selector unit includes:
    a second transfer gate for transferring an output signal of the first inverter;

a second latch for latching an output signal of the second transfer gate; and a second inverter for inverting an output signal of the second transfer gate to output the first clock selection signal.

13. The domain crossing device as recited in claim 7, wherein the phase detection period signal generator generates the phase detection period signal by synchronizing an output signal of the detection unit with the rising clock signal when the detection starting signal is activated.

14. The domain crossing device as recited in claim 13, wherein the phase detection period signal generator is a flip-flop having the detection starting signal as a reset signal, the output signal of the detection unit as a data input signal, the rising clock signal as a clock signal for generating the phase detection period signal generator.

15. The domain crossing device as recited in claim 1, wherein the means for generating the plurality of initial latency signals includes:

a delay model unit for delaying the phase detection period signal to generate a delayed phase detection period signal; and a latency detection unit for generating the plurality of initial latency signals based on the detection starting signal, the CAS latency signal and the delayed phase detection period signal.

16. The domain crossing device as recited in claim 15, wherein the latency detection unit includes:

a delay signal generator for generating a plurality of delay signals in synchronization with the internal clock signal when the detection starting signal is activated;

a delay unit for delaying the delayed phase detection period signal;

a delay detection unit for generating a latency control signal based on the plurality of delay signals and an output signal of the delay unit;

a latency selection unit for generating the plurality of initial latency signals based on the CAS latency signal and the latency control signal.

17. The domain crossing device as recited in claim 16, wherein the delay signal generator includes:

a first flip-flop for activating an output signal of the first flip-flop in synchronization with the internal clock signal;

a second flip-flop for transferring the output signal of the first flip-flop in synchronization with the internal clock signal;

a third flip-flop for outputting an output signal of the second flip-flop as a first delay signal in synchronization with the internal clock signal; and a fourth flip-flop for generating a second delay signal by synchronizing the first delay signal with the internal clock signal.

18. The domain crossing device as recited in claim 17, wherein the delay detection unit includes:

a first transfer gate and a second transfer gate for respectively transferring the first delay signal and the second delay signal in response to the output signal of the delay unit;

a first latch and a second latch for respectively latching an output signal of the first transfer gate and an output signal of the second transfer gate;

a first inverter for inverting an output signal of the first latch;

a first NAND gate for receiving an output signal of the first inverter and an output signal of the second latch;

a second inverter for inverting the output signal of the second latch;

a second NAND gate for receiving the output signal of the first inverter and an output signal of the second inverter;

a third inverter for inverting an output signal of the second NAND gate to generate a first latency control signal;

a fourth inverter for inverting an output signal of the first NAND gate to generate a second latency control signal;

a fifth inverter for inverting the output signal of the second latch; and a NOR gate for receiving the output signal of the first inverter and an output signal of the fifth inverter to generate a third latency control signal.

19. The domain crossing device as recited in claim 18, wherein the means for receiving the plurality of initial latency signals includes:

a holding unit for outputting the first clock selection signal as the second clock selection signal or outputting the second clock selection signal generated at a previous activation period of the detection starting signal as a third clock selection signal;

a comparison unit for comparing the first clock selection signal with the second clock selection signal to generate a determination signal; and an output unit for generating the clock selection signal and the plurality of latency signals based on the determination signal and a read enable signal.

20. The domain crossing device as recited in claim 19, wherein the holding unit includes:

a third transfer gate for transferring the first clock selection signal in response to the detection starting signal;

a third latch for latching an output signal of the third transfer gate;

a sixth inverter for inverting an output signal of the third latch to generate the second clock selection signal;

a fourth transfer gate for transferring the second clock selection signal in response to the detection starting signal;

a fourth latch for latching an output signal of the fourth transfer gate; and a seventh inverter for inverting an output signal of the fourth latch to generate the third clock selection signal.

21. The domain crossing device as recited in claim 20, wherein the output unit includes:

a fifth flip-flop for receiving the first initial latency signal;

a sixth flip-flop for receiving the second initial latency signal;

a seventh flip-flop for receiving the clock selection signal;

a third NAND gate for receiving an output signal of the fifth flip-flop and an output signal of the sixth flip-flop;

an eighth inverter for inverting the output signal of the fifth flip-flop to generate the first latency signal;

a ninth inverter for inverting an output signal of the third NAND gate to generate the third latency signal;

a tenth inverter for inverting the output signal of the sixth flip-flop to generate the second latency signal; and an eleventh inverter for inverting an output signal of the seventh flip-flop to generate the clock selection signal, wherein each of the fifth to the seventh flip-flops receives the determination signal and the read enable signal as enable signals and the power-up signal as a reset signal.

22. The domain crossing device as recited in claim 21, wherein each of the fifth to the seventh flip-flops includes:
- a fifth transfer gate for transferring an input signal in response to one of the enable signals;
- a fifth latch for latching an output signal of the fifth transfer gate in response to the power-up signal;
- a twelfth inverter for inverting an output signal of the fifth latch;
- a sixth transfer gate for transferring an output signal of the twelfth inverter in response to one of the enable signals; and
- a sixth lath for latching an output signal of the sixth transfer gate.

* * * * *